US007211461B2

(12) United States Patent
Sakata et al.

(10) Patent No.: US 7,211,461 B2
(45) Date of Patent: May 1, 2007

(54) MANUFACTURING APPARATUS

(75) Inventors: Junichiro Sakata, Kanagawa (JP);
Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 36 days.

(21) Appl. No.: 10/774,432

(22) Filed: Feb. 10, 2004

(65) Prior Publication Data
US 2004/0216673 A1 Nov. 4, 2004

(30) Foreign Application Priority Data
Feb. 14, 2003 (JP) ............................. 2003-037375

(51) Int. Cl.
*H01L 21/00* (2006.01)
(52) U.S. Cl. ............................. 438/69; 438/29; 438/82; 438/99; 257/E21.527
(58) Field of Classification Search .................. 438/82
See application file for complete search history.

(56) References Cited
U.S. PATENT DOCUMENTS

| 2,435,997 | A | 2/1948 | Bennett |
| 3,931,490 | A | 1/1976 | Grothe et al. |
| 4,023,523 | A | 5/1977 | Ing |
| 4,187,801 | A | 2/1980 | Monk |
| 4,627,989 | A | 12/1986 | Feuerstein et al. |
| 4,897,290 | A | 1/1990 | Terasaka et al. |
| 5,258,325 | A | 11/1993 | Spitzer et al. |
| 5,429,884 | A | 7/1995 | Namiki et al. |
| 5,817,366 | A | 10/1998 | Arai et al. |
| 6,132,280 | A | 10/2000 | Tanabe et al. |
| 6,179,923 | B1 | 1/2001 | Yamamoto et al. |
| 6,237,529 | B1 | 5/2001 | Spahn |
| 6,244,212 | B1 | 6/2001 | Takacs et al. |
| 6,326,726 | B1 | 12/2001 | Mizutani et al. |
| 6,403,392 | B1 | 6/2002 | Burrows et al. |
| 6,482,752 | B1 | 11/2002 | Yamazaki et al. |
| 2001/0006827 | A1 | 7/2001 | Yamazaki et al. |
| 2001/0009154 | A1 | 7/2001 | Nguyen et al. |
| 2002/0009538 | A1 | 1/2002 | Arai |
| 2002/0011205 | A1 | 1/2002 | Yamazaki et al. |
| 2002/0024051 | A1* | 2/2002 | Yamazaki et al. ............. 257/79 |
| 2002/0187567 | A1* | 12/2002 | Yamazaki et al. ............. 438/11 |

(Continued)

FOREIGN PATENT DOCUMENTS
JP  54-127877  10/1979

(Continued)

*Primary Examiner*—Michael Lebentritt
*Assistant Examiner*—Cheung Lee
(74) *Attorney, Agent, or Firm*—Nixon Peabody LLP; Jeffrey L. Costellia

(57) ABSTRACT

The purpose of the invention is increasing the efficiency of utilizing an EL material and providing a deposition method and a vapor deposition apparatus which is one of the film formation systems which are excellent in throughput and uniformity in film thickness in forming an EL layer. According to the invention, evaporation is performed by moving or reciprocating an evaporation source holder in which a plurality of containers (crucible) each encapsulating an evaporation material are set only in an X direction while moving a substrate at regular intervals. Further, in the plurality of evaporation source holders, film thickness meters of adjacent evaporation sources are disposed alternately so as to sandwich the movement pathway of the substrate.

26 Claims, 14 Drawing Sheets

U.S. PATENT DOCUMENTS

| | | |
|---|---|---|
| 2002/0197760 A1 | 12/2002 | Yamazaki et al. |
| 2003/0162314 A1 | 8/2003 | Yamazaki et al. |
| 2003/0194484 A1 | 10/2003 | Yamazaki et al. |
| 2003/0221620 A1 | 12/2003 | Yamazaki |
| 2004/0031442 A1 | 2/2004 | Yamazaki et al. |
| 2004/0035360 A1 | 2/2004 | Yamazaki et al. |
| 2004/0040504 A1 | 3/2004 | Yamazaki et al. |
| 2004/0123804 A1 | 7/2004 | Yamazaki et al. |
| 2004/0139914 A1 | 7/2004 | Yamazaki et al. |

FOREIGN PATENT DOCUMENTS

| | | |
|---|---|---|
| JP | 10-041069 | 2/1998 |
| JP | 2001-093667 | 4/2001 |
| JP | 2001-247959 | 9/2001 |
| JP | 2002-060926 | 2/2002 |
| JP | 2004-035964 | 2/2004 |
| WO | WO 01/31081 | 5/2001 |

\* cited by examiner

MANUFACTURING APPARATUS

BACKGROUND OF THE INVENTION

1. Field of the Invention

The present invention relates to a manufacturing apparatus having a film formation system for depositing materials which can be deposited by vapor deposition (hereinafter, an evaporation material), a light emitting device which has an organic compound layer as a light emitting layer and for which the manufacturing apparatus is used, and a manufacturing method thereof. Specifically, the invention relates to a manufacturing apparatus and a film formation method (a vapor deposition method) for forming a film by vaporizing an evaporation material from a plurality of evaporation sources disposed to be opposite to a substrate.

2. Description of the Related Art

In recent years, research related to a light emitting device having an EL element as a self-luminous light emitting element has been advanced. The light emitting device is referred to as an organic EL display or an organic light emitting diode. Since these light emitting devices have characteristics such as a fast response suitable for movie display, low voltage, low power consumption driving, or the like, they attracts an attention for a next generation display including new generation's cellular phones and portable information terminals (PDA).

An EL element having an organic compound layer as a light emitting layer has a structure in which an organic compound layer (hereinafter, referred to as an EL layer) is sandwiched between an anode and a cathode. Electro luminescence is generated in the EL layer by applying an electronic field to the anode and the cathode. Luminescence obtained from the EL device includes luminescence generated in returning to a base state from a singlet excited state (fluorescence) and luminescence generated in returning to a base state from a triplet excited state (phosphorescence).

The EL layer has a laminated structure typified "a hole transporting layer, a light emitting layer and an electron transporting layer". EL materials for forming an EL layer are classified broadly into low-molecular (monomer) materials and high-molecular (polymer) materials. The low-molecular materials are deposited using a vapor deposition system.

A conventional vapor deposition apparatus has a substrate holder where a substrate is set, a crucible encapsulating an EL material, that is an evaporation material, a shutter to prevent the EL material to be sublimed from rising, and a heater for heating the EL material in a crucible. Then, the EL material heated by the heater is sublimed and deposited on a rolling substrate. At this time, in order to deposit uniformly, the distance between the substrate and the crucible needs to be 1 m or more.

According to a conventional vapor deposition apparatus and a conventional vapor deposition method, when an EL layer is formed by vapor deposition, almost all the sublimed EL material is adhered to an inner wall, a shutter or an adherence preventive shield (a protective plate for preventing an evaporation material from adhering to an inner wall of a film formation chamber) at inside of the film formation chamber of the vapor deposition system. Therefore, in forming the EL layer, an efficiency of utilizing the expensive EL materials is extremely low i.e. about 1% or less and manufacturing cost of a light emitting device becomes very high.

According to a conventional vapor deposition system, in order to provide a film with uniform thickness, it is necessary to separate a substrate from an evaporation source 1 m or more. Therefore, the vapor deposition apparatus grows in size, a period required for exhausting each film formation chamber of the vapor deposition apparatus is prolonged; therefore, film formation speed is slowed down and throughput is lowered. Also, in using a large substrate, the film thickness between a center portion and a marginal portion of a substrate easily becomes uneven. Further, the vapor deposition apparatus has a structure for rotating a substrate; therefore, there is a limit in the vapor deposition apparatus which handles a large substrate.

In view of the above-described problems, the present inventors have proposed a vapor deposition apparatus (Reference 1. Japanese Patent Laid-Open No. 2001-247959 and Reference 2. Japanese Patent Laid-Open No. 2002-60926).

SUMMARY OF THE INVENTION

These and other objects, features and advantages of he present invention will become more apparent upon reading of the following detailed description along with the accompanied drawings.

The present invention provides a vapor deposition apparatus as one of the manufacturing apparatus that promotes an efficiency of utilizing an EL material to reduce manufacturing costs and is excellent in uniformity or throughput of forming an EL layer and a vapor deposition method. Further, the present invention provides a light emitting device fabricated by the vapor deposition apparatus and the vapor deposition method according to the present invention and a manufacturing method of the light emitting device.

Further, the invention provides a manufacturing apparatus for depositing an EL material efficiently on a large substrate having a size of, for example, 320×400 mm, 370×470 mm, 550×650 mm, 600×720 mm, 680×880 mm, 1000×1200 mm, 1100×1250 mm or 1150×1300 mm. Also, the invention provides a vapor deposition apparatus that makes a uniform film thickness even on a whole surface of a large substrate.

A larger substrates has larger deposition area, therefore it requires more EL material. In the case of the conventional vapor deposition method which requires the distance between the substrate and the crucible to be 1 m or more and an efficiency of utilizing the expensive EL material is extremely low i.e. about 1% or less, a large amount of EL material is required in a large crucible (or an evaporation boat). Moreover, throughput is lowered since it takes more time to heat the EL material stored in the large crucible until the deposition speed becomes stable. Also, it takes time for cooling the EL material. In particular, substances are not heated nor cooled easily under vacuum. Further, when a large amount of EL material is divided into a plurality of crucibles, it becomes difficult to control the deposition speed of each crucible; therefore it becomes difficult to keep a film thickness even. Moreover, even though a plurality of heaters and crucibles are provided, it is difficult to provide a plurality of identical evaporation sources due to small differences in quality and shape.

In the vapor deposition apparatus according to the invention, an interval distance between the substrate and the evaporation source during vapor deposition is typically narrowed to 30 cm or less, preferably 20 cm or less, more preferably from 5 to 15 cm. The utilization efficiency of evaporation materials as well as throughput is thus markedly enhanced and both of substrate and evaporation source move relative to each other. That is, in the evaporation chamber according to the invention, the evaporation source holder having a container encapsulating an evaporation material is moved (or reciprocated) at a constant speed in only one direction (X direction, for example) with respect to the substrate, and the substrate is moved in a direction (Y direction, for example) at regular intervals so as to be orthogonal to the movement direction of the evaporation source holder.

A manufacturing apparatus according to the invention, comprising a film formation system for depositing an evaporation material from an evaporation source disposed to be opposite to a substrate to form a film over the substrate, wherein a film formation chamber in which the substrate is disposed includes an evaporation source, a unit for moving the evaporation source in X direction, and a unit for moving the substrate in Y direction, and film is formed by repeatedly moving the evaporation source in the X direction, then the substrate in the Y direction at regular intervals.

According to the invention, a film with uniform thickness can be deposited on a large substrate by utilizing an evaporation source controlled stable in its deposition speed. According to the invention, the deposition speed can be easily controlled stable by reducing the area or the number of evaporation outlets. Further, a movement mechanism of the evaporation source can be made rather simple, therefore the evaporation source can be reciprocated a plurality of times by increasing the movement speed, thus the deposition speed can be increased.

According to the invention, an evaporation source is moved in one direction or reciprocated, then a substrate is moved at a regular interval, and again the evaporation source is moved in one direction or reciprocated, then the position of the substrate is moved slightly. The deposition is conducted on the whole surface of substrate by repeating the aforementioned operations.

A manufacturing apparatus according to the invention comprising a film formation system for depositing an evaporation material over a substrate from an evaporation source disposed to be opposite to the substrate, wherein a film formation chamber has a unit for moving a substrate in Y direction, the film formation chamber is connected to a setting chamber and the setting chamber has the evaporation source and a unit for moving the evaporation source from the setting chamber to inside of the film formation chamber in X direction, and a film is formed by repeatedly moving the evaporation source in the film formation chamber in the X direction, then the substrate in the Y direction at regular intervals.

In each of the above-described operations, the evaporation source may be reciprocated in X direction, and in the case where a film thickness is required to be thick, the evaporation source may be reciprocated a plurality of times. The movement speed of the evaporation source may be decreased for controlling the film thickness. Note that the deposition speed differs according to the evaporation materials; therefore, a desired film thickness can be obtained by controlling the movement speed of the evaporation source appropriately.

The container in which the evaporation material is stored is disposed so that the evaporation material is not exposed to the atmosphere in the setting chamber. Thus, the evaporation material can be ease of handling and the contamination of the evaporation material can be avoided. In the setting chamber, a film thickness meter is also provided. In the invention, the film thickness meter does not monitor while the evaporation source is moving, thus the number of exchanges of the film thickness meter is decreased.

The film formation chamber and the setting chamber are connected to a vacuum discharge treatment chamber, and have a means for bringing in material gas or cleaning gas.

Note that, the means for bringing in the material gas is for bringing in a material gas radically reacted by a plasma generation unit. The material gas includes one or a plurality of the following: monosilane, disilane, trisilane, $SiF_4$, $GeH_4$, $GeF_4$, $SnH_4$, $CH_4$, $C_2H_2$, $C_2H_4$, or $C_6H_6$. The cleaning gas includes one or a plurality of the following: Ar, $N_2$, $H_2$, $F_2$, $NF_3$, or $O_2$.

A plurality of the evaporation sources are provided, which move parallel to each other. Further, the evaporation sources move in the X directions for deposition, and also can move in Z directions so as to control the intervals between the substrate.

Furthermore, the substrate may be reciprocated in the film forming chamber, for example, in the Y direction in the film formation chamber. For example, after the evaporation source is moved in one direction, a position of the substrate is moved slightly to deposit on the whole surface of the substrate, then the substrate may be returned to the original position for the same treatment again.

The substrate may be moved at a constant speed while the evaporation source are moved or reciprocated in one direction for depositing a material on the whole surface of the substrate. In this case, both of the substrate and the evaporation source move, therefore the deposition is performed obliquely with respect to the side of the substrate.

When a plurality of evaporation sources which move in one direction are disposed in one film formation chamber at regular intervals and moved sequentially, layers including different organic compounds can be laminated in the same film formation chamber. For example, in the case where two organic compound layers are laminated from two evaporation sources, firstly the first evaporation source is moved for depositing a layer including the first organic compound in a belt shape or linear shape, then the substrate is moved, and the second evaporation source is moved and deposited while the first evaporation source is moved again, then the layer including the second organic compound is deposited to be laminated in a belt shape or linear shape on the firstly deposited area, and a layer including the first organic compound is deposited in a belt shape or linear shape adjacently to the firstly deposited area.

By repeating this operation, two layers can be formed on a whole surface of the substrate. A manufacturing apparatus according to the invention, comprising a film formation system which forms a film on the substrate by depositing an evaporation material from a plurality of evaporation sources disposed to be opposite to the substrate, wherein a film formation chamber in which the substrate is disposed includes a first evaporation source, a first unit for moving the first evaporation source in X direction, a second evaporation source, a is second unit for moving the second evaporation source in X direction, and a unit for moving the substrate in Y direction, and while making a movement speed of the first evaporation source in X direction and a movement speed of the second evaporation source in X direction different, a film is formed by repeatedly moving the substrate in the Y direction at regular intervals.

The plurality of evaporation sources, film thickness meters of adjacent evaporation sources are disposed alternately so as to sandwich the movement pathway of the substrate.

In the case where a plurality of evaporation sources are provided in one film formation chamber, film thickness meters are preferably disposed alternately so as to sandwich the movement pathway of the substrate. That is, in two evaporation source holders which move adjacently in parallel to each other, each of the film thickness meters has a longer interval than a side of the substrate. Note that, in this case the evaporation sources wait at alternate positions. By disposing the evaporation sources alternately so as to sandwich the movement pathway of the substrate, an accurate monitoring can be achieved without adhering evaporation material from the adjacent evaporation sources to the film thickness meters.

A plurality of evaporation sources can be moved in the same directions in one film formation chamber for performing co-deposition from the evaporation sources moving in parallel to each other. For example, a host evaporation source and a dopant evaporation source are moved in the same direction in parallel to each other for deposition by using different movement mechanisms (such as a robot arm). Also, co-deposition can be performed between a plurality of crucibles provided in the evaporation sources. For example, a crucible in which a host evaporation material is stored and a crucible in which a dopant evaporation material is stored are disposed in one evaporation source and the positions of the crucibles are adjusted so that the deposition centers of two crucibles can meet at a certain point of the substrate.

Note that, referred to as the evaporation source in this specification comprises a evaporation source holder, a container (such as a crucible) provided in the evaporation source holder, a shutter for shielding the opening of the container, a heater, and a crucible position adjustment mechanism.

A manufacturing apparatus according to the invention, comprising a loading chamber, a delivery chamber connected to the loading chamber, a plurality of film formation chambers connected to the delivery chamber, wherein a film formation chamber in which a substrate is disposed includes a plurality of evaporation sources, a unit for moving the plurality of evaporation sources in X direction, a unit for moving the substrate in Y direction, and a film is formed by moving or reciprocating the plurality of evaporation sources in X direction while moving the substrate in Y direction at a constant speed.

According to the above-described structure, a throughput is enhanced since a substrate can be deposited while delivered.

In the case where a large substrate and operation is utilized, an evaporation mask becomes large; therefore the mask may have a deflection around its center part although the side part where the mask is attached is tightened. In view of aforementioned problem, an auxiliary wiring is provided for the mask so that the mask can be adhered to the substrate without causing a deflection by straining the wiring. This auxiliary wiring is preferably utilizing a different metal from a mask material, for example a memory metal.

DETAILED DESCRIPTION OF THE PREFERRED EMBODIMENTS

An embodiment mode of the invention is hereinafter described.

[Embodiment Mode 1]

Figure 1:
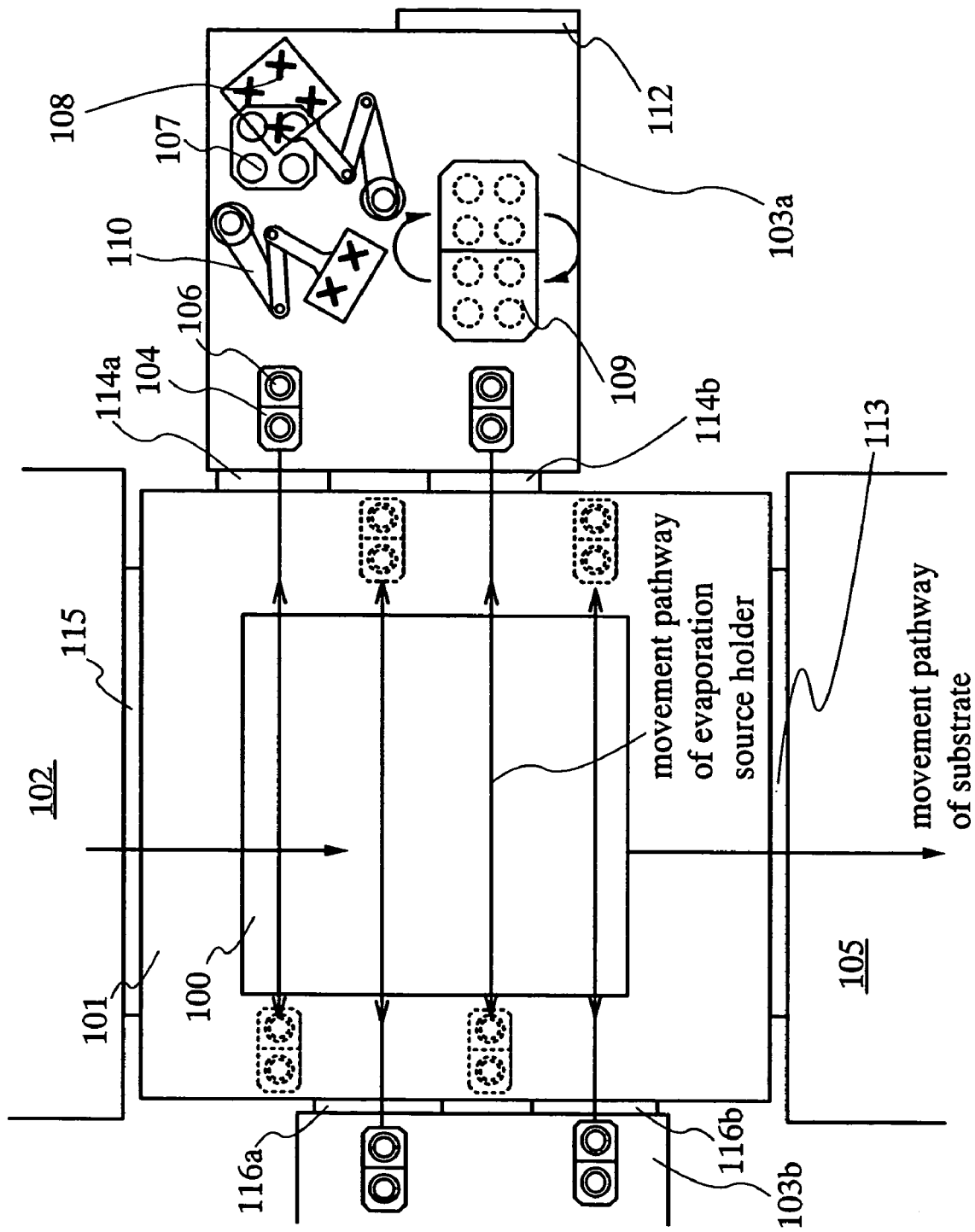
FIG. 1 is a top plan view showing Embodiment Mode 1.

FIG. 1 shows a top plan view of a manufacturing apparatus of the invention.

In FIG. 1, reference numeral 100 is a substrate, 101 is a film formation chamber, 102 and 105 are delivery chambers, 103a and 103b are crucible setting chambers, 104 is an evaporation source holder, 106 is a crucible, 107 is a lid setting table, 108 is a lid delivery robot, 109 is a container setting turntable, 110 is a crucible delivery robot, 112 is a door, 113, 114a, 114b, 115, 116a, and 116b are shutters dividing each chamber.

The substrate 100 is delivered from the delivery chamber 102 into the film formation chamber 101. In the case of depositing selectively, an alignment of an evaporation mask and the substrate is performed prior to the deposition.

In the evaporation source holder 104, two crucibles in which EL materials are stored 106 are provided. Note that a sliding shutter (not shown) is provided for each crucible. FIG. 1 shows an example in which an evaporation source holder having two crucibles, four evaporation source holders, and two crucible setting chambers are provided, however, the invention is not exclusively limited to the structure of FIG. 1. The two crucibles may store the same material, and in the case of the material which are hard to deposit in particular, providing two crucibles can increase the evaporation amount, which increases the deposition speed. The two crucibles may store different materials as well, and while depositing one crucible, a shutter of another crucible can be closed for preheating. Further, while depositing one crucible, a shutter of another crucible can be closed for cooling the crucible which finished deposition. Also, in the case where two crucibles store different materials, co-deposition can be performed at the same time by tilting the crucible setting position appropriately so that the deposition centers can meet at a certain point of the substrate. In the invention, a deposition is conducted on a substrate is deposited by moving or reciprocating these four evaporation source holders in one direction.

By moving the evaporation source holder in one direction, an evaporation film is formed in a linear shape or a belt shape with respect to the substrate. Subsequently, the substrate, and then the evaporation source holder again are moved. By repeatedly moving the evaporation source holder and the substrate sequentially, an evaporation film with uniform thickness can be formed on the whole surface of the substrate. Further, in the case where the substrate and the evaporation source holder are moved at the same time, an evaporation film is formed in a linear shape or a belt shape obliquely with respect to the side of the substrate. In the invention, a deposition is conducted on the whole surface of the substrate by moving or reciprocating the substrate in one direction. Moreover, as a substrate is moved according to the deposition, deposition as well as a delivery of the substrate is performed when the movement direction and delivery direction are the same. Therefore, in that case, the invention can be an appropriate manufacturing apparatus for treating a large amount of substrates sequentially. As a substrate is delivered according to deposition, the size of the manufacturing apparatus as a whole can be reduced.

Further, the evaporation source holder waits in the crucible setting chamber at all times, heating and keeping the heat until the deposition speed becomes stable. Note that, a film thickness monitor (not shown) is provided in the crucible setting chamber. Once the deposition speed becomes stable, a substrate is delivered into the delivery chamber 102 and the evaporation source holder is moved by opening a shutter. After deposition, the substrate is moved into the crucible setting chamber and the shutter is closed. The substrate may be delivered into the delivery chamber 105 after closing the shutter.

According to the invention, the time required for film formation can be reduced. Conventionally, in the case of refilling an EL material, a film formation chamber is required to be opened and vacuumed after refilling the crucible. Therefore, time required for refilling becomes long, which can cause degradation in throughput. Also, the evaporation source is fixed in the film formation chamber conventionally; therefore it took quite a long time for cooling the heated evaporation source.

In the invention, a substrate and an evaporation source have a short distance between them, therefore time for deposition can be shortened and an efficiency of utilizing the material can be improved by reducing the amount of adhering substances to other than the substrate (such as an inner wall of a film formation chamber). By reducing the adhering substances, the number of maintenance like cleaning the inner wall of the film formation chamber can be reduced as well.

The time required for deposition by moving the evaporation source holder is short; therefore an evaporation film with uniform thickness can be obtained. The EL material heated under vacuum is not easily cooled and deposition speed can be maintained almost constant if for a relatively short time.

The evaporation source holder does not execute a complex movement but moves only in one direction; therefore a simple movement mechanism can be employed.

In the manufacturing apparatus in FIG. 1, a vacuum sealed crucible is set in a container on the container setting turntable 109 in the crucible setting chamber, a lid of the container is opened by the lid delivery robot 108 under vacuum in the crucible setting chamber, the crucible is taken out from the container by the crucible delivery robot 110, and the crucible can be set in the evaporation source holder without being exposed to the atmosphere in the crucible setting chamber. By providing the crucible setting chamber, a highly pure EL material can be set in the film formation chamber without being exposed to the atmosphere, further the high cleanliness of the film formation chamber 101 can be maintained.

A heater may be incorporated in the container setting turntable 109 for preheating the EL material. Further, by increasing the number of the containers set in the container setting chamber 109 and providing and preheating a spare crucible, a whole crucible can be exchanged when the EL material in the crucible runs short, thus the time required for the exchange can be reduced.

Each of the four evaporation source holders may serve as an evaporation source holder for a hole transporting layer, an evaporation source holder for a light emitting layer, an evaporation source holder for an electron transporting layer, and an evaporation source holder for an electron injection layer for example, and can laminate the layers by depositing sequentially.

By storing the same EL material in the two evaporation source holders, in the case where the material in one evaporation source holder runs out, another evaporation source holder can be utilized, thus deposition can be performed in succession without refilling along the path. Moreover, in the case of storing the same EL material in the four evaporation source holders, the EL material four times as much can keep being deposited with a high throughput by exchanging one by one, thus it is very effective for a large substrate in particular.

In order to measure the deposition speed with a film thickness monitor accurately, a shield is preferably provided between the two evaporation source holders in the crucible setting chamber. Further, crucible setting chambers where the evaporation source holders wait are provided alternately as shown in FIG. 1 for keeping the distance between the adjacent evaporation source holders and measuring the deposition speed with the film thickness monitor accurately.

A common crucible setting chamber for two evaporation source holders is provided in an above-described example, however, the invention is not exclusively limited to this structure. Note that the crucible setting chamber as shown in FIG. 1 does not necessarily have to be provided.

[Embodiment Mode 2]

Figure 2:
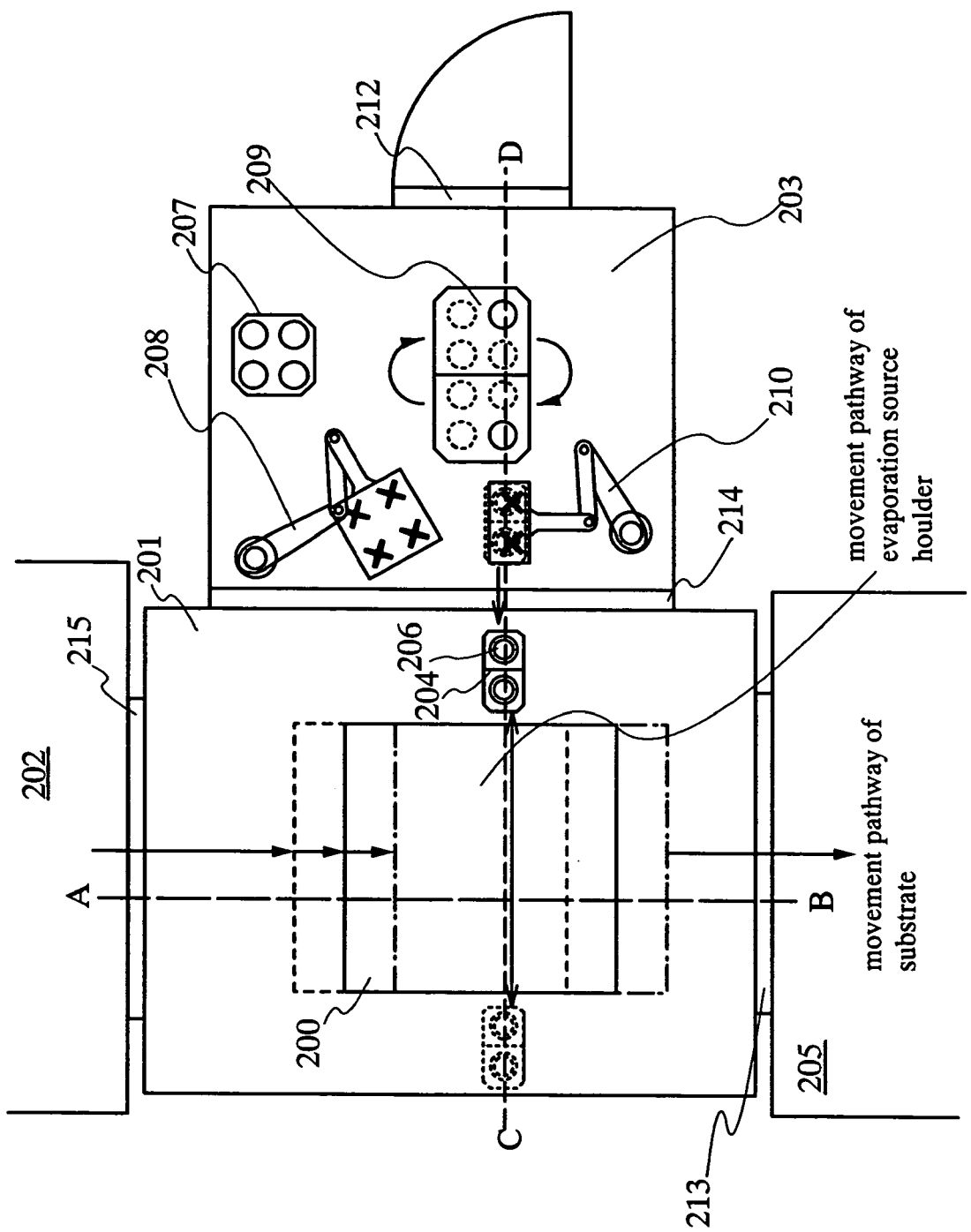
FIG. 2 is a top plan view showing Embodiment Mode 2.

FIG. 2 shows another example of the manufacturing apparatus of the invention.

The manufacturing apparatus shown in FIG. 2 has one evaporation source holder and one crucible setting chamber in one film formation chamber.

In FIG. 2, reference numeral 200 is a substrate, 201 is a film formation chamber, 202 and 205 are delivery chambers, 203 is a crucible setting chamber, 204 is an evaporation source holder, 206 is a crucible, 207 is a lid setting table, 208 is a lid delivery robot, 209 is a container setting turntable, 210 is a crucible delivery robot, 212 is a door, 213, 214 and 215 are shutters for dividing each chamber.

Figure 3A:
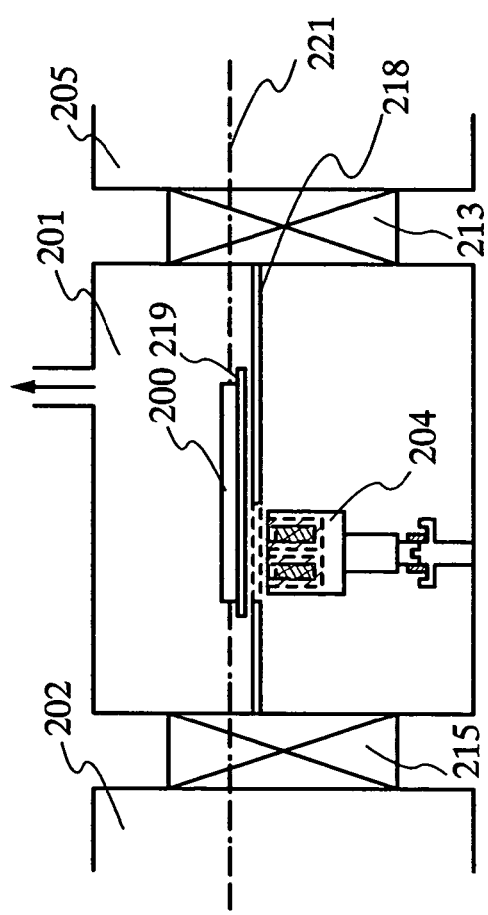
FIGS. 3A and 3B are cross-sectional views showing Embodiment Mode 2.
Figure 3B:
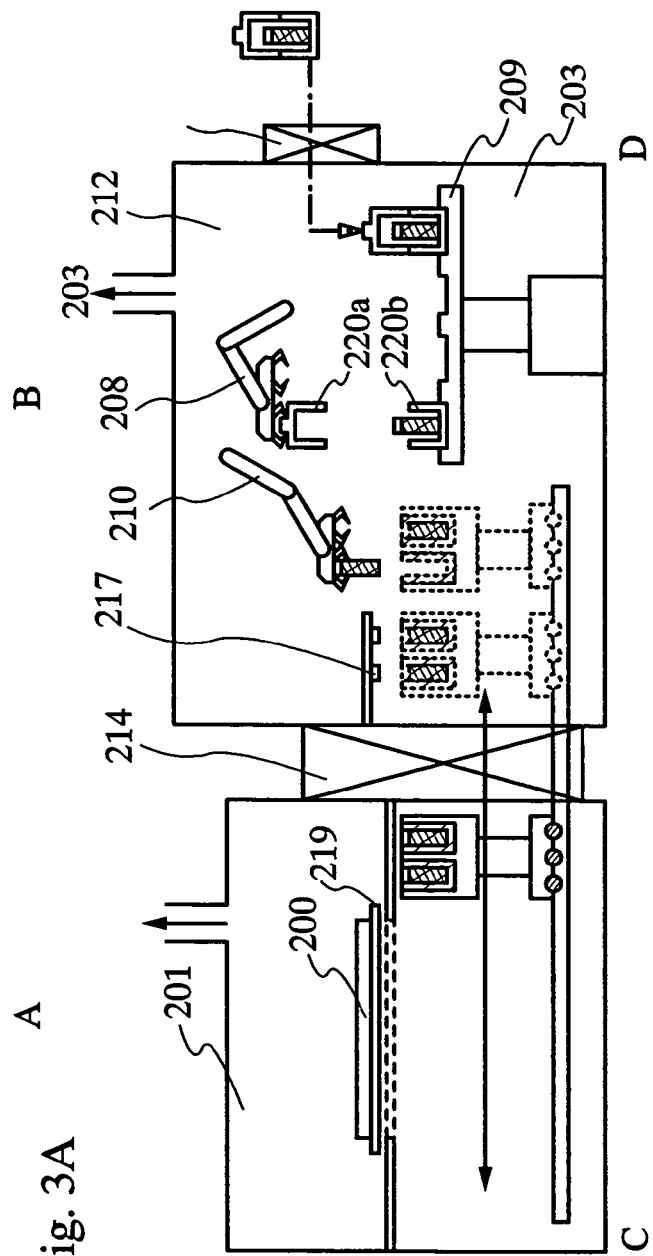

A sectional view taken by cutting along a dotted line A-B in FIG. 2 is shown in FIG. 3A, and a sectional view taken by cutting along a dotted line C-D in FIG. 2 is shown in FIG. 3B. Here, a direction of the dotted line A-B is referred to as a Y direction of the substrate and a direction of the dotted line C-D is referred to as an X direction of the substrate. The evaporation source holder 204 can move only in the X direction and the substrate moves only in the Y direction. It is to be noted that portions which are identical in FIG. 2 are denoted by the same reference numerals in FIGS. 3A and 3B. Reference numeral 217 is a film thickness monitor, 218 is a substrate shutter, and 219 is an evaporation mask.

In FIG. 3A, a conveyance system 221 is provided in each of the chambers 201, 202, and 205. A substrate can be delivered by these conveyance systems 221 without exposing each of the chambers 201, 202, and 205 to the atmosphere. Note that, the conveyance system 221 may be a belt or a tray, or a robot having an arm for moving the evaporation mask 219 together with the substrate 200.

The substrate 200 and the evaporation mask 219 may be aligned in the film formation chamber 201 or a delivery chamber 202, for which an alignment system (not shown) is provided.

Hereinafter explained is a process up to the deposition.

First, a highly pure EL material is stored in a crucible under reduced pressure or inert atmosphere, and the crucible is vacuum sealed by a container. The container is constituted by a top container 220a and a bottom container 220b, a pipe for evacuating the air inside after assembling the lids and a bulb for closing the pipe.

Figure 4A:
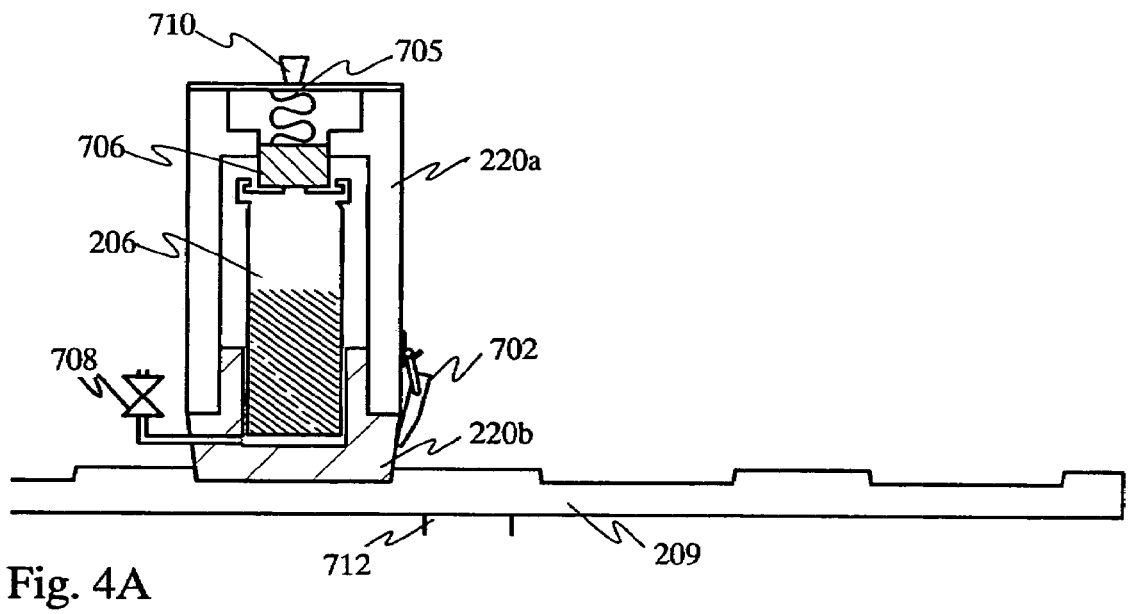
FIGS. 4A and 4B are cross-sectional views showing a setting chamber of Embodiment Mode 2.

A configuration of the delivery container is described in more details with reference to FIG. 4A. A second container, which are separated into a top container (220a) and a bottom container (220b) both used for delivery, comprises a fixing unit 706 for fixing a first container (crucible) provided on top of the second container, a spring 705 for pressurizing the fixing unit, a gas inlet 708 which is provided under the second container and serves as a gas path for keeping the second container pressured, an O ring for fixing the top container 220a and the bottom container 220b, and a clamp 702. In the second container, a first container 206 encapsulating a refined evaporation material is provided. Note that the second container is preferably formed by a material including stainless steel, and the first container is preferably formed by a material including titanium.

A refined evaporation material is encapsulated in the first container 206 by a material maker. The top container 220a and the bottom container 220b are superposed to each other interposing the O ring, the top container 220a and the bottom container 220b are fixed with a clamp 702, and the first container 206 is encapsulated in the second container. After that, the pressure in the second container is reduced by way of the gas inlet 708, nitrogen atmosphere is infused instead, and the first container 206 is fixed with the fixing unit 706 by adjusting the spring 705. Note that a drying agent may be provided in the second container. Thus, by keeping the second container under vacuum, reduced pressure, or a nitrogen atmosphere, the evaporation material can be avoided from being adhered by even a slight oxygen or moisture.

The crucible 206 is delivered from a door 212 of the crucible setting chamber 203 while encapsulated in vacuum in the container constituting of the top container 220a and the bottom container 220b. First, put the delivered container on the container setting turntable 209 and unclamp the clamp 702. (FIG. 4A) The clamp 702 can not be unclamped under the atmospheric pressure since the inside is under vacuum. Then, the container setting turntable 209 (with a heater incorporated therein) is rotated by an axis of rotation 712 for delivering the container inside of the crucible setting chamber 203. Subsequently, the setting chamber 203 is vacuum evacuated so that the lid (top container 220a) can be taken off. The container may be heated by a heater incorporated in the container setting turntable 209 while being vacuum evacuated. Thus the heating time required later can be reduced.

Figure 4B:
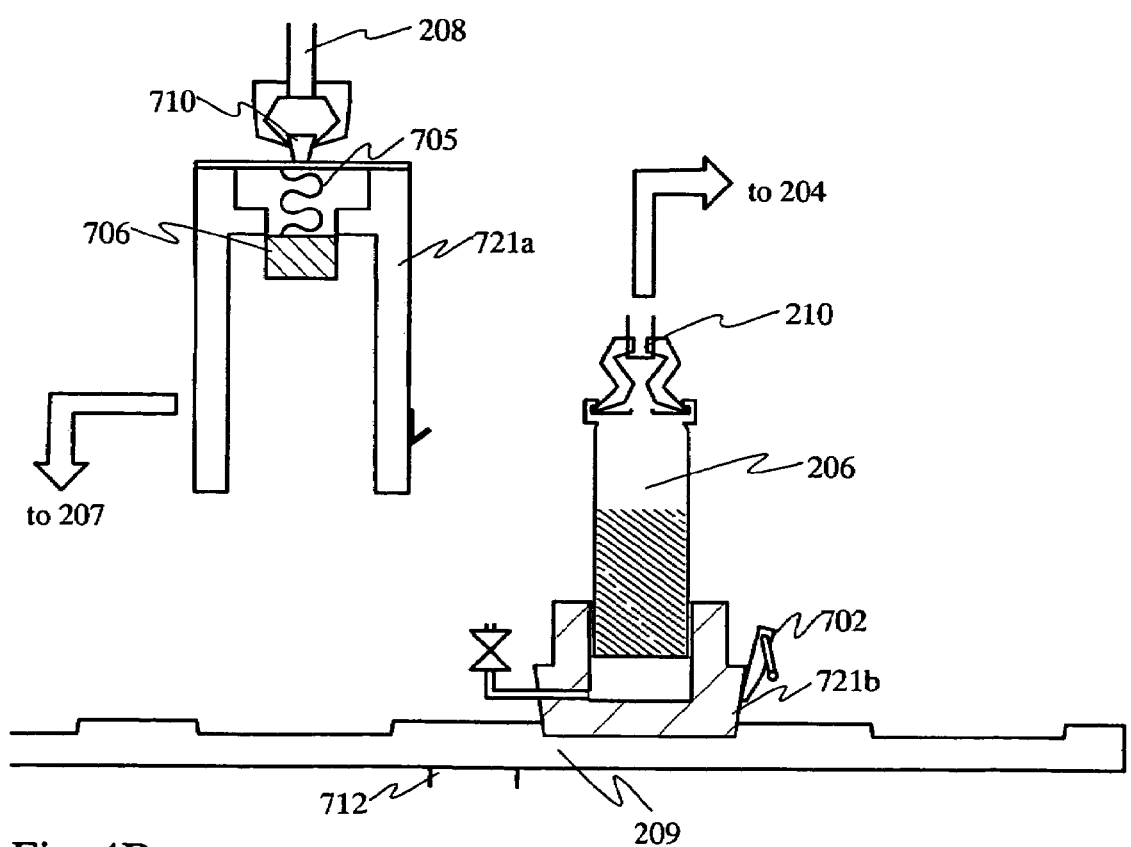

Subsequently, a lid of the container is lift up by the lid delivery robot 208 and moved to the lid setting table 207. Note that, the delivery mechanism of the invention is not limited to the structure shown in FIG. 4B in which the first container 206 is delivered by pinching at upper part of the first container (grab 710), but may be delivered by pinching (picking) the side faces thereof.

The crucible under vacuum is taken out from the crucible setting chamber by the crucible delivery robot 210 and set in the evaporation source holder 204 without being exposed to the atmosphere. Note that the evaporation source holder is moved into the crucible setting chamber 203 when setting the crucible.

The evaporation source holder 204 is moved to the unit where the film thickness monitor 217 is provided. By heating the evaporation source holder 204 by a heater incorporated in the evaporation source holder, keep the temperature at which the deposition speed becomes stable measured by the film thickness monitor 217. The film thickness monitor 217 is used only while waiting; therefore it has a longer life with fewer frequency of exchange.

The shutter 214 is opened and the evaporation source holder 204 is moved into the film formation chamber 201, then the substrate shutter 218 is opened and the evaporation source holder 204 is moved in the X direction so as to pass under the substrate 200 for deposition.

By moving the evaporation source holder in the X direction, an evaporation film is formed in a linear or a belt shape with respect to the substrate. Subsequently the substrate is moved in the Y direction only, and then the evaporation source holder is moved again. By repeating the movements of the evaporation source holder and the substrate, an evaporation film with uniform thickness can be formed over a whole surface of the substrate.

In the vapor deposition apparatus shown in FIGS. 2, 3A and 3B, a distance between the substrate 200 and the evaporation source holder 204 during vapor deposition is typically narrowed to 30 cm or less, preferably 20 cm or less, and more preferably from 5 to 15 cm. The utilization efficiency of evaporation materials as well as throughput is thus markedly enhanced. These distances may be adjusted by a movement unit for moving the evaporation source holder in a Z direction.

Once deposition to the substrate is finished, the substrate shutter 218 is closed. Then the shutter 214 is opened again and the evaporation source holder 204 is moved and returns to the crucible setting chamber 203. The crucible temperature of the crucible is adjusted while measuring by the film thickness monitor 217 and the crucible waits ready.

Meanwhile, the deposited substrate is delivered into the delivery chamber 205 through the shutter 215 and the next substrate is delivered into the film formation chamber 201 through the shutter 213.

When the next substrate is delivered into the film formation chamber 201, the shutter 214 is opened again and the evaporation source holder 204 is moved into the film formation chamber 201, and the substrate shutter 218 is opened and the evaporation source holder 204 is moved in the X direction so as to pass under the substrate for deposition.

Thus, deposition can be performed with a high throughput according to the invention.

By providing the crucible setting chamber, a highly pure EL material can be set in the film formation chamber without being exposed to the atmosphere, further the high cleanliness of the film formation chamber 201 can be maintained.

The present embodiment mode can be freely combined with Embodiment Mode 1.

[Embodiment Mode 3]

FIGS. 5A–5E shows an example of co-deposition. Note that a vapor deposition apparatus shown in FIGS. 5A–5E are different from FIGS. 1 and 2.

Figure 5A:
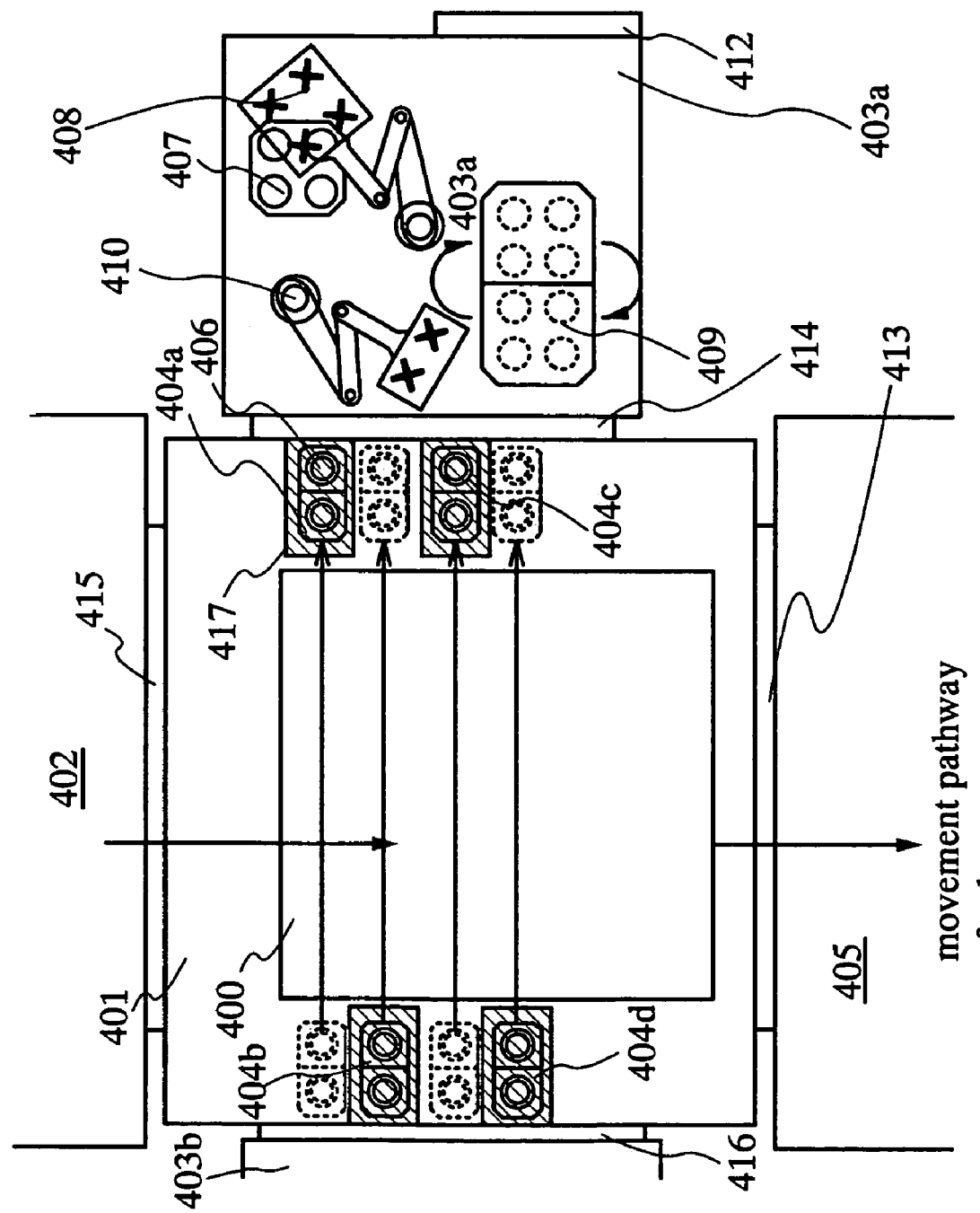
FIGS. 5A to 5E are top plan views showing Embodiment Mode 3.

While the evaporation source holders shown in FIGS. 1 and 2 are movable into the crucible setting chamber, the evaporation source holder shown in FIG. 5A moves only inside the film formation chamber in the vapor deposition system. The evaporation source holder shown in FIG. 5A moves shorter distance as compared to the ones shown in FIGS. 1 and 2, therefore the compactness of the vapor deposition apparatus can be realized.

In FIG. 5A, reference numeral 400 is a substrate, 401 is a film formation chamber, 402 and 405 are delivery chambers, 403a and 403b are crucible setting chambers, 404a to 404d are evaporation source holders, 406 is a crucible, 407 is a lid setting table, 408 is a lid delivery robot, 409 is a container setting turntable, 410 is a crucible delivery robot, 412 is a door, 413, 414, 415, and 416 are shutters for dividing each chamber, and 417 is a film thickness monitor setting plate.

The substrate 400 is delivered from the delivery chamber 402 into the film formation chamber 401. In the case of depositing selectively, an alignment of the evaporation mask and the substrate is performed prior to the deposition.

In the evaporation source holder 404, two crucibles 406 in which EL materials are stored are provided. Note that a sliding shutter (not shown) is provided for each crucible. FIG. 5A shows an example in which four evaporation source holders each having two crucibles are provided, however, the invention is not exclusively limited to the structure of FIG. 5A.

The evaporation source holders 404a to 404d wait under the film thickness monitor setting plates 417 at all times, heating and keeping the heat until the deposition speed becomes stable. Note that the film thickness monitor is provided between the film thickness monitor setting plate 417 and the evaporation source holder. Once the deposition speed becomes stable, a substrate is delivered into the film formation chamber 402 and the shutter 415 is opened and the evaporation source holders 404a to 404d are sequentially moved or reciprocated. In the invention, an evaporation film is formed in a linear or a belt shape. Once depositing one line, the substrate is moved and the next line is deposited, and these operations are repeated. When the deposition is finished, the evaporation source holder is moved under the film thickness monitor setting plate 417 again, then the shutter is closed.

In FIG. 5A, the film thickness monitor setting plates 417 under which the evaporation source holders wait are provided alternately so as to sandwich the movement pathway of the substrate, for keeping the distances between the adjacent evaporation source holders and measuring the deposition speed with the film thickness monitor accurately.

Each of the four evaporation source holders 404a to 404d may serve as an evaporation source holder 404a for a hole transporting layer, an evaporation source holder 404b for a light emitting layer, an evaporation source holder 404c for an electron transporting layer, and an evaporation source holder 404d for an electron injection layer for example, and can laminate the layers by depositing sequentially.

Here, co-deposition by utilizing the evaporation source holders 404a and 404b is described with reference to FIGS. 5B and 5C.

Figure 5B:
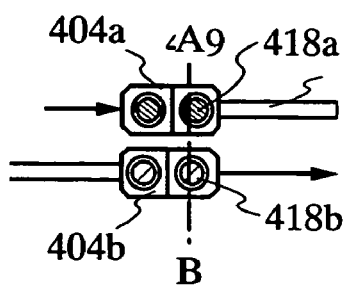

FIG. 5B shows a top plan view in deposition, in which two evaporation source holders are moved in the same direction. The evaporation source holder 404a moves in the direction to which an arm 419 is shrunk, while the evaporation source holder 404b moves in the direction to which the arm 419 is stretched. The evaporation source holder 404a stores a material A 418a as a host material, while the evaporation source holder 404b stores a material B 418b as a dopant material. Note that the arm 419 moves and reciprocates only in one direction.

Figure 5C:
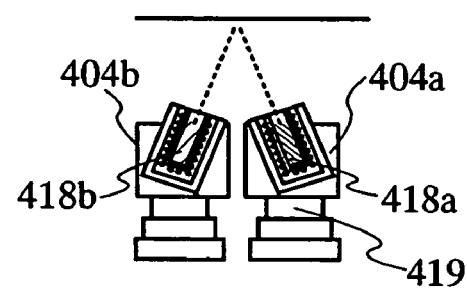

In deposition, as shown in FIG. 5C which is a sectional view taken by cutting along a short dash line A-B in FIG. 5B, the positions of the two crucibles are adjusted so that the deposition centers of the two crucibles can meet at a certain point of the substrate. The point of the substrate is located between the evaporation source holders 404a and 404b. In this case, deposition is performed by utilizing the two evaporation source holders at the same time.

Figure 5D:
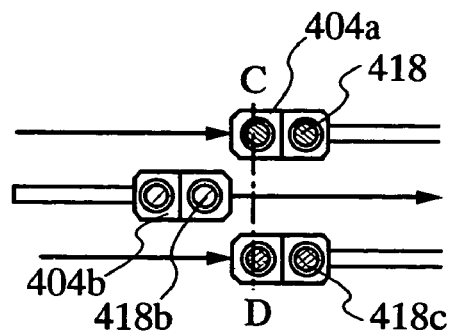
Figure 5E:
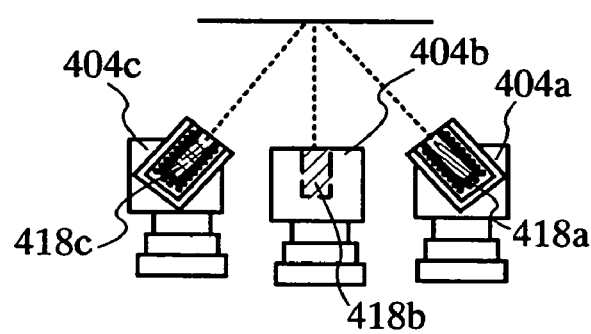

FIGS. 5D and 5E show an example where three different kinds of materials are used for co-deposition by utilizing the evaporation source holders 404a to 404c.

FIG. 5D shows a top plan view in deposition, in which three evaporation source holders are moved in the same direction. The evaporation source holders 404a and 404c move in the direction to which an arm is shrunk, while the evaporation source holder 404b moves in the direction to which the arm is stretched. The evaporation source holder 404a stores a material A 418a as a host material, the evaporation source holder 404b stores a material B 418b as a dopant material, and the evaporation source holder 404c stores a material C 418c as a second dopant material. In this case, deposition is performed by utilizing the three evaporation source holders at the same time.

In deposition, as shown in FIG. 5E which is a sectional view taken by cutting along a short dash line C-D in FIG. 5D, the positions of the three crucibles are adjusted so that the deposition centers of the three crucibles can meet at a certain point of the substrate.

In the vapor deposition apparatus shown in FIGS. 5A–5E, an evaporation film with uniform thickness can be formed on the whole surface of the substrate by repeating the movements of the evaporation source holders and the substrate sequentially.

The vapor deposition apparatus shown in FIG. 5A has the film thickness monitor setting plates 471 alternately, therefore deposition at high precision can be performed in such multitargeted deposition as this by monitoring each of the deposition speed accurately by the film thickness monitor.

The present embodiment mode can be freely combined with Embodiment Modes 1 and 2.

[Embodiment Mode 4]

Figure 6A:
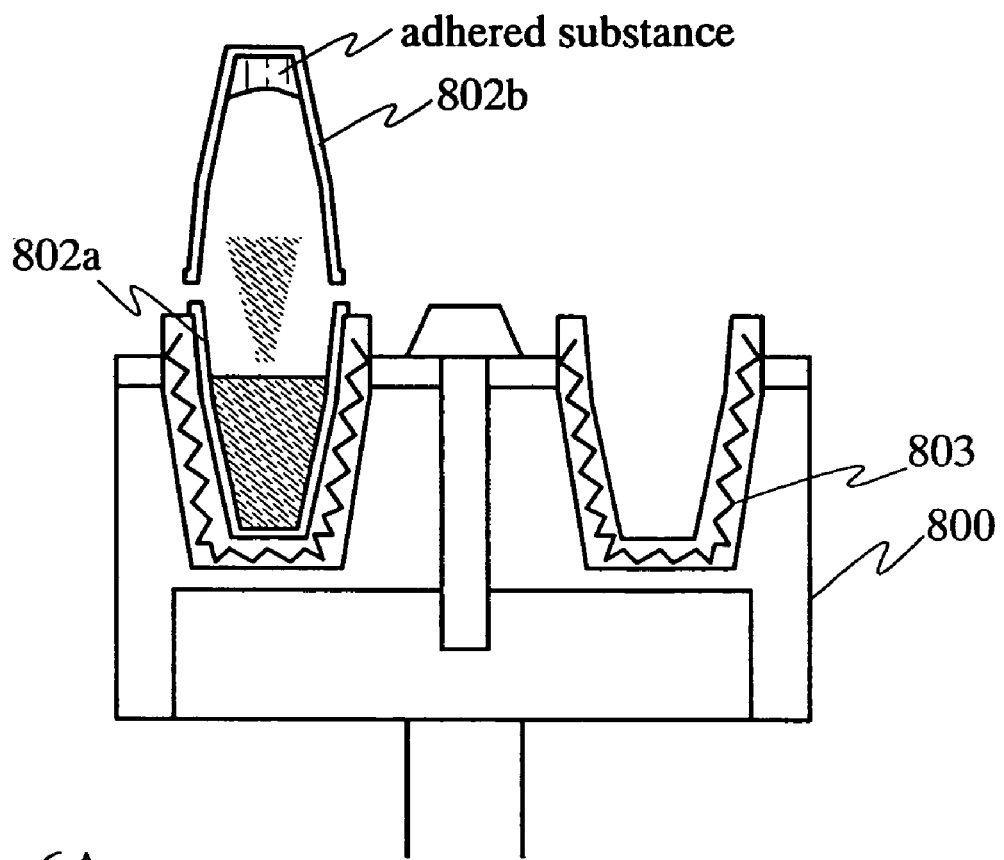
FIGS. 6A and 6B are cross-sectional views showing Embodiment Mode 4.
Figure 6B:
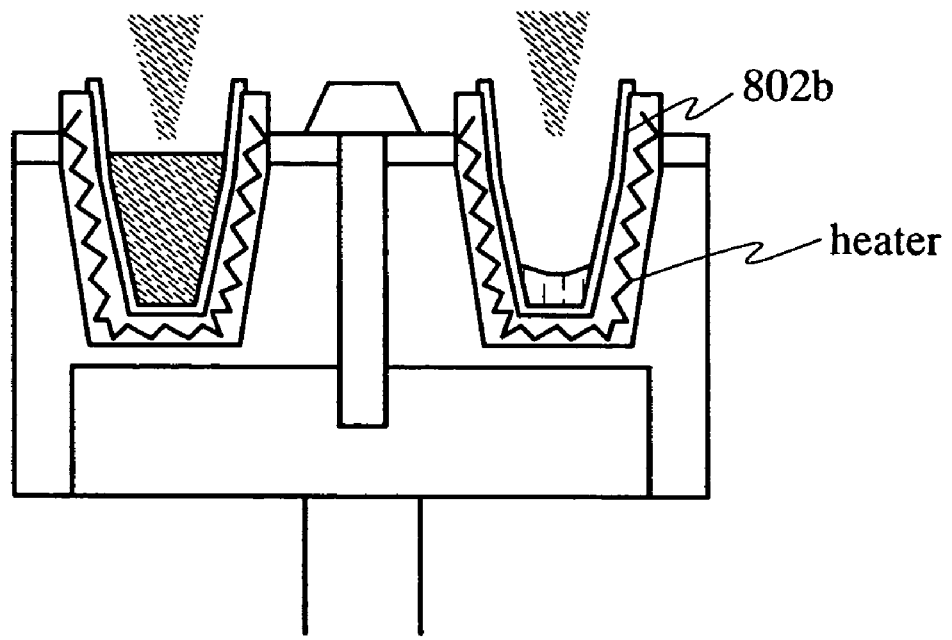

In the present embodiment mode, an example where a container is utilized as a shutter is shown in FIGS. 6A and 6B.

FIG. 6A shows a state where the movement of an evaporation source holder 800 is halted and film formation is stopped. The heated material by a heater 803 sublimes from a container 802a and adheres to an inner wall of a shutter/container 802b. Deposition is performed by the open and shut operations of the shutter 802b.

Then the shutter 802b is taken off in a setting chamber (not shown) and adhered substances are stored. The adhered substances may further be refined. Note that a branch or a projection may be provided on the inner wall of the shutter 802b so that the adhering substances can adhere efficiently without falling.

The shutter/container 802b is set in the evaporation source holder 800 in the setting chamber and heated, thus the adhered substances are sublimed again. (FIG. 8B)

By the above-described process, the evaporation material can be reutilized.

In the case of assembling with the manufacturing apparatus of FIG. 1, a mechanism for automatically performing all or a part of the operations for taking off the shutter 802b and setting the shutter/container 802b in the evaporation source holder 800 may be provided in the setting chamber.

In the case of assembling with the manufacturing apparatus of FIG. 5A, the shutter/container 802b may be set or taken off from the film thickness monitor setting plate 417 as needed.

The present embodiment mode may be freely combined with Embodiment Modes 1,2, and 3.

[Embodiment Mode 5]

Figure 7A:
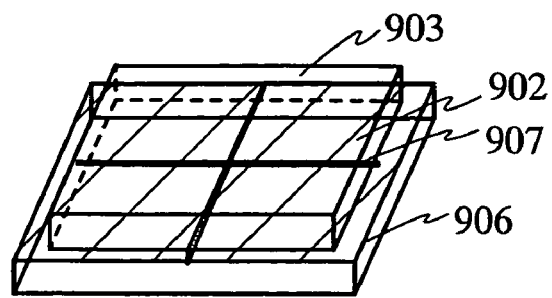
FIGS. 7A to 7C are perspective views and a cross-sectional view showing Embodiment Mode 5.
Figure 7B:
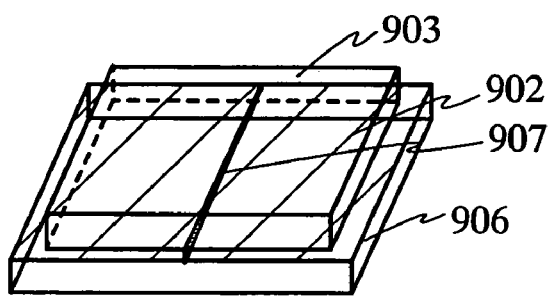
Figure 7C:
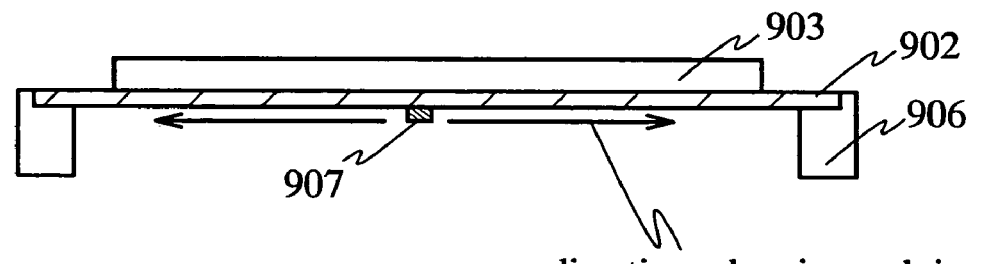

In the present embodiment mode, a mask applicable to a large substrate having a size of, for example, 320×400 mm, 370×470 mm, 400×500 mm, 550×650 mm, 600×720 mm, 620×730 mm, 680×880 mm, 730×920 mm, 1000×1200 mm, 1100×1250 mm, 1150×1300 mm is shown in FIGS. 7A–7C in order to provide a method for depositing an EL material efficiently.

In the case of holding the above-described large substrate by a substrate holding unit (such as a permanent magnet), the substrate may partially have a deflection.

In the invention, in the case where a large substrate is utilized for forming a plurality of panels (forming a plurality of panels from one substrate), an auxiliary wiring is provided to a mask along scribe lines. That is, without deflecting the mask by utilizing the auxiliary wiring made of a memory metal and the like, the deposition is conducted on the substrate the area which are not in contact with the substrate holding unit by subliming the evaporation material from the evaporation source holder. Thus, a deflection of a large substrate can be as small as 1 mm or less.

The evaporation mask may be in close contact with the substrate, or a substrate holder or an evaporation mask holder for fixing with a certain distance may be provided appropriately.

FIG. 7A is a perspective view of a substrate 903 and a mask 902, showing an example where auxiliary wirings 907 are disposed crosswise. The shape of the auxiliary wiring 907 is not limited, for example the auxiliary wiring 907 may be disposed linearly as shown in FIG. 7B.

By utilizing the auxiliary wiring 907, a deflection of a mask can be neutralized.

FIG. 7C is a cross-sectional view of the substrate 903 and the mask 902. The auxiliary wiring 907 is formed by a metal plate (typically a memory metal or a titanium and the like) or a wire. A mask frame 906 has a hollow for fitting the mask 902 as shown in FIG. 7C. The mask 902 is stretched by the mask frame from the auxiliary wiring 907 in the center, thus the adhesion of the substrate and the mask is enhanced.

The present embodiment mode may be freely combined with any one of Embodiment Modes 1 to 4.

The invention with above-described structures is described in more details with reference to the following embodiments.

[Embodiment]

[Embodiment 1]

Figure 8:
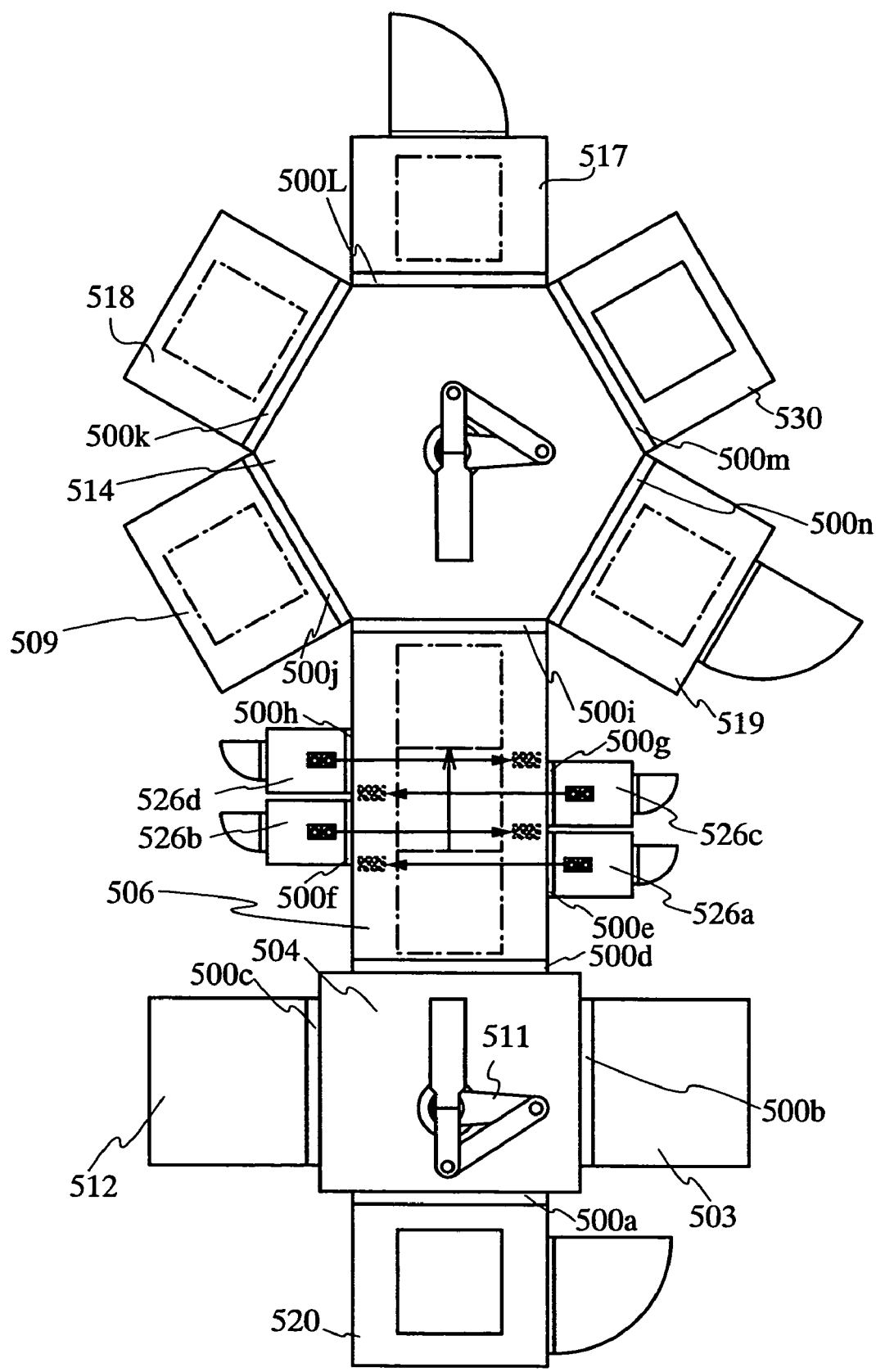
FIG. 8 is a diagram showing a manufacturing apparatus of Embodiment 1.

FIG. 8 is a top plan view of a multichamber manufacturing apparatus. The manufacturing apparatus shown in FIG. 8 has chambers aligned with intent to improve the throughput.

FIG. 8 is a multichamber manufacturing apparatus comprising gates 500a to 500n, a substrate loading chamber 520, a sealing and taking-out chamber 519, delivery rooms 504 and 514, film formation chambers 506 and 509, setting chambers 526a to 526d for setting evaporation sources, a pretreatment chamber 503, a sealing substrate loading chamber 517, and a sealing chamber 518.

Hereinafter described is a process for fabricating a light emitting device by delivering a substrate which is previously provided with an anode (a first electrode) and an insulator (partition) for covering edge portions of the anode into a manufacturing apparatus shown in FIG. 8. Note that in the case of manufacturing an active matrix light emitting device, a substrate is previously provided with a plurality of thin film transistors (current control TFTs) connected to the anode, other thin film transistors (such as a switching TFTs), and a driver circuit configured with thin film transistors. Further, a passive matrix light emitting device can be fabricated by the manufacturing apparatus shown in FIG. 8 as well.

First, the substrate is set in the substrate loading chamber 520. The substrate can be in sizes of 320×400 mm, 370×470 mm, 550×650 mm, 600×720 mm, 680×880 mm, 1000×1200 mm, 1100×1250 mm, and even a substrate as large as 1150×1300 mm.

The substrate (the substrate provided with the anode and the insulator for covering the edge portions of the anode) set in the substrate loading chamber 520 is delivered into the delivery chamber 504. Note that the delivery chamber 504 has a vacuum evacuation unit and a delivery mechanism (such as a delivery robot) for delivering or flipping the substrate, and the other delivery chamber 514 has a vacuum evacuation unit and a delivery mechanism as well. The robot provided in the delivery chamber 504 can flip the substrate and deliver the flipped substrate into the film formation chamber 506. Further, the delivery chamber 504 can keep its inside under atmospheric pressure or vacuum. As the delivery chamber 504 is connected to the vacuum evacuation chamber, it is capable of being vacuumed by vacuum evacuation or being under atmospheric pressure by bringing in inert gas after the vacuum evacuation.

The above-described vacuum evacuation chamber has a magnetic levitation turbomolecular pump, a cryopump, or a dry pump. The pump makes it possible for the delivery chamber to reach a vacuum level of $10^{-5}$ to $10^{-6}$ Pa. Also, reverse diffusion of impurities from the pump side and the evacuation system can be prevented. In order not to let impurities inside the device, inert gas such as nitrogen or noble gas is brought in. The gas brought into the device has to be a highly pure gas refined by a gas refining machine prior to being brought into the device. Accordingly, a gas refining machine is required to give the highly pure gas before it is brought into the vapor deposition system. In this way, oxygen, moisture, and other impurities can be removed from the gas in advance; therefore these impurities can be prevented from entering in the device.

Before setting the substrate in the substrate loading chamber 520, the first electrode (anode) is preferably cleaned with a porous sponge (typically a PVA (polyvinyl alcohol) or a nylon sponge and the like) impregnated with a surfactant (alkalescent), thereby removing dusts from a surface thereof. As for a cleaning mechanism, a cleaning apparatus having a roll brush (for example, made of PVA) which contacts a face of a substrate such that the roll brush rotates around an axis line parallel to the face of the substrate may be used, or another cleaning apparatus having a disk brush (for example, made of PVA) which contacts a face of a substrate such that the disk brush rotates around an axis line vertical to the face of the substrate may be used.

In order to be free from shrinkage, it is preferable that vacuum heating is performed just before forming an organic compound layer by vapor deposition. The resultant substrate is delivered from the delivery chamber 504 into the pretreatment chamber 503 where, in order to thoroughly remove moisture, or any other gases contained in the substrate, annealing for degasification is performed on the substrate under vacuum (a degree thereof being $5 \times 10^{-3}$ Torr (0.665 Pa) or less and, preferably, in the range from $10^{-4}$ Torr to $10^{-6}$ Torr). Particularly, when an organic resin film is used as a material of an interlayer insulating film or a partition, an organic resin material tends to absorb moisture depending on the type thereof. Since there is a risk of degasification, it is effective that, before an organic compound layer is formed, the organic resin material is heated at a temperature in the range of from 100° C. to 250° C., preferably in the range of from 150° C. to 200° C., for example, for 30 minutes or more, and then the heated organic resin material is left for natural cooling for 30 minutes and vacuum heating is performed for removing absorbed moisture.

Further, in the film formation chamber 512, the hole injection layer comprising a polymer material may be formed by ink-jet printing, spin coating, or spraying. Further, after applied by the ink-jet printing, a film thickness may be made even by a spin coater. Similarly, after applied by the spraying, the film thickness may be made even by a spin coater. Further, the substrate is vertically placed, and then a film may be formed on the substrate under vacuum by inkjet printing.

An aqueous solution (also referred to as PEDOT/PSS) of poly (ethylene dioxythiophene)/poly (styrenesulfonic acid), an aqueous solution of polyaniline/camphor sulfonic acid (also referred to as PANI/CSA), PTPDES, Et-PTPDEK, PPBA or the like which act as the hole injection layer (anode buffer layer) may be applied over an entire surface of the first electrode (anode) and baked. It is preferable that such baking is performed in the pretreatment chamber 503.

When the hole injection layer comprising a polymer material is formed by coating such as spin coating, flatness is improved whereby coverage and uniformity in thickness of a film to be formed thereon become favorable. Particularly, film thickness of the light emitting layer becomes uniform, thus a uniform luminescence can be obtained. In this case, it is preferable that, after the hole injection layer is formed by coating, vacuum heating (100 to 200° C.) is performed on the hole injection layer by vapor deposition just before film formation.

For example, after a surface of the first electrode (anode) is cleaned by using the sponge, the substrate is delivered into the substrate loading chamber 520, and then, the film formation chamber 512. After the aqueous solution (PEDOT/PSS) of poly (ethylene dioxythiophene)/poly (styrene sulfonic acid) is applied on an entire surface of the first electrode (anode) with a film thickness of 60 nm by spin coating, the resultant substrate is delivered into the pretreatment chamber 503, pre-baked at 80° C. for 10 minutes, actually baked at 200° C. for one hour, and vacuum heated (170° C. for 30 minutes followed by cooling for 30 minutes) just before vapor deposition. Then, the resultant substrate is delivered into the film formation chamber 506 and a light emitting layer is formed by vapor deposition without being exposed to the atmosphere. Particularly, in the case where an ITO film is used as an anode material and a surface thereof is not uniform or a minute particle is present on the surface thereof, such detrimental influences can be mitigated by making a film thickness of PEDOT/PSS 30 nm or more.

Further, when a film of PEDOT/PSS is formed by spin coating, the film is formed on the whole surface of the substrate. Therefore, the film formed on each of an edge portion, a peripheral portion, a terminal portion, a connecting region between the cathode and a lower wiring and the like is preferably removed, and in this case, it is preferable that such removal is selectively performed in the pretreatment chamber 503 using a mask by means of $O_2$ ashing or the like. The pretreatment chamber 503 is provided with a plasma generator in which one or a plurality of gases Ar, H, F, and O are excited to generate plasma, thus dry etching is performed. Further, an UV irradiation mechanism may be provided in the pretreatment chamber 503 in order that an ultraviolet ray irradiation can be executed for an anode surface treatment.

Thereafter, the substrate is appropriately delivered into the film formation chamber 506 which is connected to the delivery chamber 504. Over the delivered substrate, a low molecular organic compound layer including a hole injection layer, a hole transporting layer, a light emitting layer, an electron transporting layer, or an electron injection layer is appropriately formed. By appropriately selecting the EL material, the light emitting element which emits mono-color (specifically white, red, green, or blue color) light as a whole body of the light emitting element can be fabricated.

The film formation chamber 506 is provided with an evaporation source holder which can move (or reciprocate) in the X direction as shown in Embodiment Mode 1. In the film formation chamber, a plurality of evaporation source holders are provided (four in this embodiment), having a plurality of containers (crucibles) in which EL materials are encapsulated. For example, a first evaporation source holder stores an EL material for forming a light emitting layer, a second evaporation source holder stores an EL material for forming an electron transporting layer, a third evaporation source holder stores an EL material for forming an electron injection layer, and a fourth evaporation source holder stores an inorganic material for forming a cathode buffer layer, and each of them are used sequentially for deposition. Further in the film formation chamber 506, the substrate is moved (or reciprocated) in the Y direction so as to be orthogonal to the movement direction of the evaporation source holder. The substrate is set with its face down while aligning the position of the evaporation mask with a CCD or the like, and a deposition can selectively be performed by resistive heating deposition. Once the deposition is finished, the substrate is delivered into the next delivery chamber.

The containers (crucibles) in which the EL materials are encapsulated are set in the setting chambers 526a to 526d. The EL materials are encapsulated in the container (typically a crucible) by a material maker in advance. Note that the container is preferably set without being exposed to the atmosphere; therefore the crucible is brought into the setting chamber remaining encapsulated in the second container when delivered from the material maker. The crucible is taken out of the second container in the setting chamber under vacuum, and then set in the evaporation source holder. Thus, the crucible and the EL material stored therein can be protected from contamination.

Subsequently, the substrate is taken out of the film formation chamber 506 by a delivery mechanism set in the delivery chamber 514 and delivered into the film formation chamber 509 without being exposed to the atmosphere, and then a cathode (or a protective film) is formed. The cathode is an inorganic film (a film formed by co-depositing aluminum and an alloy such as MgAg, MgIn, $CaF_2$, LiF, CaN or an element of group 1 or 2 of the periodic table, or a laminated film thereof) formed by resistive heating deposition. The cathode may also be formed by sputtering.

In the case of fabricating a top emission or a dual emission light emitting device, the cathode is preferably transparent or translucent, which is a thin film of the above-described metal film (1 to 10 nm in thickness) or a laminated film of a thin film of the above-described metal film (1 to 10 nm in thickness) with a transparent conductive film. In this case, a film comprising the transparent conductive film (for example, ITO (indium oxide-tin oxide alloy), indium oxide-zinc oxide alloy ($In_2O_3$—ZnO), or zinc oxide (ZnO) and the like) may be formed in the film formation chamber 509 by sputtering.

A light emitting element having a laminated structure is fabricated by the above-described process.

Further, the substrate is delivered into the film formation chamber 509 connected to the delivery chamber 514, and a protective film comprising a silicon nitride film or a silicon oxynitride film may be formed for sealing. In this case, a target comprising silicon or a target comprising silicon oxide, or a target comprising silicon nitride is provided in the film formation chamber 509. Further, a protective film may be formed by moving a bar-shaped target with respect to the fixed substrate. Also, a protective film may be formed by moving the substrate with respect to the fixed bar-shaped target.

For example, by utilizing a diskform target comprising silicon, a silicon nitride film can be formed on the cathode by making the atmosphere inside the film formation chamber a nitride atmosphere or an atmosphere including nitride and argon. Further, a carbon-based thin film (DLC film, CN film, and amorphous carbon film) may be formed as a protective film, and a CVD chamber may be provided additionally. The diamond-like carbon film (also called as DLC film) can be formed by a method such as plasma CVD, (typically, RF plasma CVD, microwave CVD, electron cyclotron resonance (ECR) CVD, or hot filament CVD), combustion-flame, sputtering, ion beam deposition, or laser deposition. The reaction gas used for deposition which is composed of hydrogen gas and hydrocarbon gas (for example, $CH_4$, $C_2H_2$, or $C_6H_6$) is subjected to ionization with glow discharge, and ions are accelerated for collision can be finished in a short time and a light emitting device can be fabricated with a high throughput.

Although not shown in the figure, such systems are provided as a control system for controlling the operation in each chamber, a control system for delivering the substrate between each of the chambers, and a control system for automation by controlling the delivery paths of the substrate between each of the chambers.

In the manufacturing apparatus shown in FIG. 8, a substrate having a transparent conductive film (or a metal film (TIN)) as an anode is delivered in, and after forming an organic compound layer, a transparent or translucent cathode (for example, a laminated film of a thin metal film (Al, Ag) and a transparent conductive film) is formed, thereby a top emission (or a dual emission) light emitting element can be formed. Note that the top emission light emitting element is an element which emits light generated in the organic compound layer passing through the cathode.

In the manufacturing apparatus shown in FIG. 8 also, a substrate having a transparent conductive film as an anode is delivered in, and after forming an organic compound layer, a cathode is formed with a metal film (Al, Ag), thereby a bottom emission light emitting element can be formed. Note that the bottom emission light emitting element is an element which emits light generated in the organic compound layer from the anode as a transparent electrode toward a TFT, passing through the substrate.

The present embodiment may be freely combined with Embodiment Modes 1 or 2.

[Embodiment 2]

Figure 9:
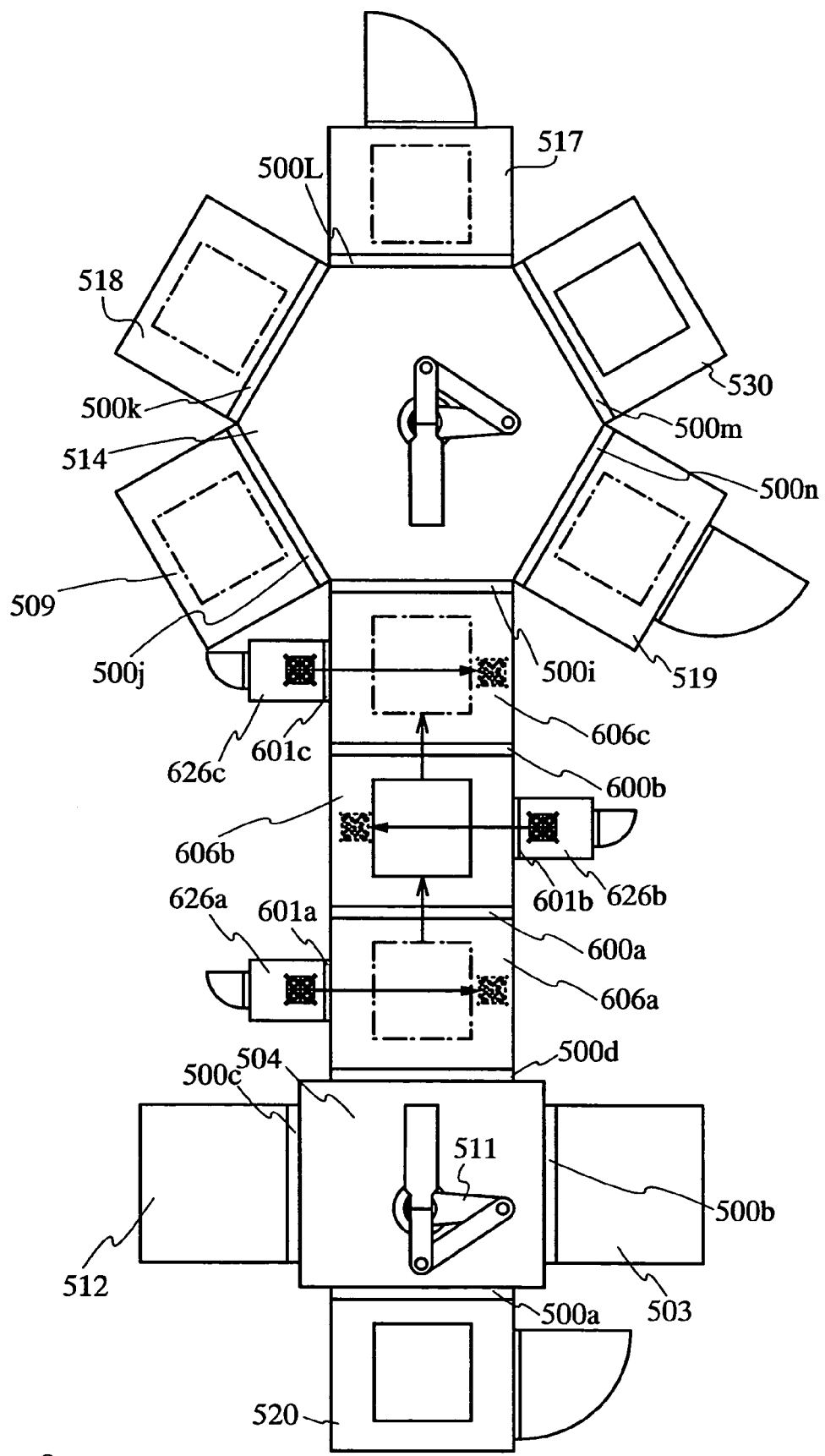
FIG. 9 is a diagram showing a manufacturing apparatus of Embodiment 2.

FIG. 9 shows a multichamber having a different structure from Embodiment 1. It is to be noted that portions which are identical in FIG. 8 are denoted by the same reference numerals besides film formation chambers 606a to 606c.

The present embodiment describes an example of fabricating a full color light emitting device.

According to Embodiment 1, a substrate (a substrate having an anode and an insulator for covering the end of the anode) is delivered into the delivery chamber 504.

Subsequently, the substrate is delivered by the delivery mechanism 511 into a film against a cathode to which negative self-bias is applied to perform the deposition. Further, the CN film may be formed by using $C_2H_4$ gas and $N_2$ gas as reaction gas. Still further, the DLC film or the CN film is a transparent or translucent insulating film against visible light. The term "transparent against visible light" used herein is intended to mean that a transmission factor of the visible light is in the range from 80 to 100% while the term "translucent against visible light" used herein is intended to mean that a transmission factor of the visible light is in the range from 50 to 80%.

Next, the substrate on which the light emitting element formed is delivered from the delivery chamber 514 into a sealing and taking-out chamber 519.

A sealing substrate is set in the sealing substrate loading chamber 517 from outside. It is preferable to perform annealing under vacuum in advance in order to remove impurities such as moisture. In the case of forming a sealing member on the sealing substrate for bonding to the substrate provided with the light emitting element, the sealing member is formed in the sealing chamber 518 and the sealing substrate on which the sealing member is formed is delivered into a sealing substrate stock chamber 530. A drying agent may be provided for the sealing substrate in the sealing chamber 518. An evaporation mask may be stocked in the sealing substrate stock chamber 530. Although the example of forming the sealing member on the sealing substrate is shown here, the invention is not exclusively limited to this structure and a sealing member may be formed on the substrate with the light emitting element formed as well.

Next, the substrate and the sealing substrate are bonded in the sealing and taking-out chamber 519 and UV light is irradiated to a bonded pair of substrates with an ultraviolet light irradiation mechanism provided in the sealing and taking-out chamber 519 to cure the sealing member. Note that ultraviolet light curable resin is used as a sealing member here; however, the present invention is not specifically limited as long as the sealing member is an adhesive.

Then, the bonded pair of substrates is taken out from the sealing and taking-out chamber 519.

As described above, by using the manufacturing apparatus shown in FIG. 8, the light emitting element is not exposed to outside air until sealed hermetically; therefore the highly reliable light emitting device can be fabricated. Further, deposition is performed by moving the evaporation source and the substrate in the film formation chamber 506, therefore the deposition formation chamber 606a which is connected to the delivery chamber 504. Then the substrate and an evaporation mask (not shown) are superposed to each other and the alignment is adjusted, then the vapor deposition of an EL layer for emitting a red light is selectively performed. Note that the deposition is performed by moving an evaporation source holder from a setting chamber 626a in the X direction and moving the substrate in the Y direction.

Subsequently, the substrate passes a shutter 600a and an evaporation mask (not shown) is superposed with a shift in position, then the alignment is adjusted and the vapor deposition of the EL layer for emitting blue light is selectively performed.

Subsequently, the substrate passes a shutter 600b and an evaporation mask (not shown) is superposed with a shift in position, then the alignment is adjusted and the vapor deposition of the EL layer for emitting green light is selectively performed. Note that the shutters 600a and 600b are provided for preventing mixing colors.

Then the substrate is taken out from the film formation chamber 606c by a delivery mechanism provided in the delivery chamber 514 and delivered into the film formation chamber 509 without being exposed to the outside air, then a cathode (or a protective film) is formed.

Thus, a light emitting element capable of a full color display which shows a red, green and blue light as a light emitting device can be fabricated.

In the embodiment, an example of forming EL layers of R, G, and B by using one evaporation mask, however, different masks may be used respectively.

Further, one evaporation source holder is shown in each of the film formation chambers 606a to 606c, however, a plurality of evaporation source holders may be provided as well.

In the following step, a light emitting element having a laminated structure is fabricated according to Embodiment 1.

The present embodiment may be freely combined with Embodiment Modes 1, 2, or Embodiment 1.

[Embodiment 3]

Figure 10A:
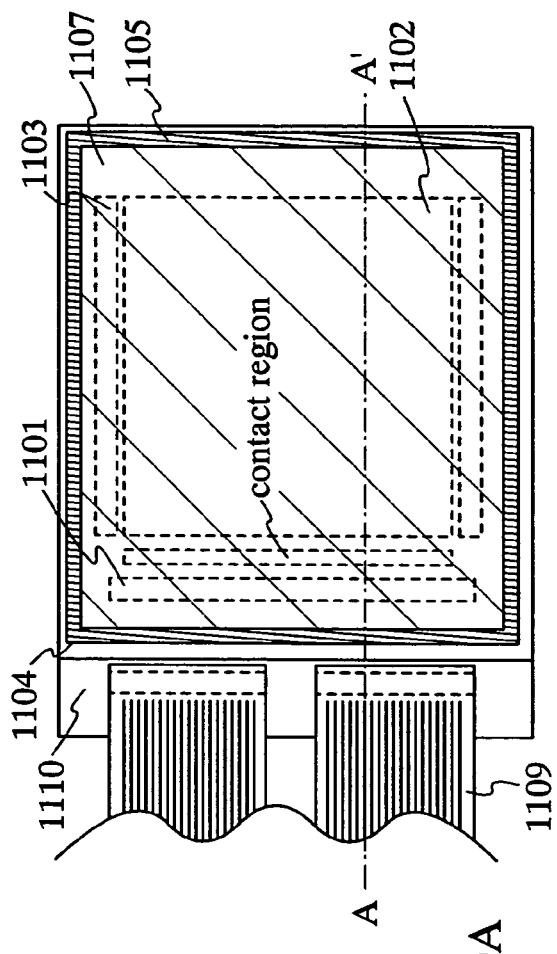
FIGS. 10A and 10B are diagrams showing Embodiment 3.
Figure 10B:
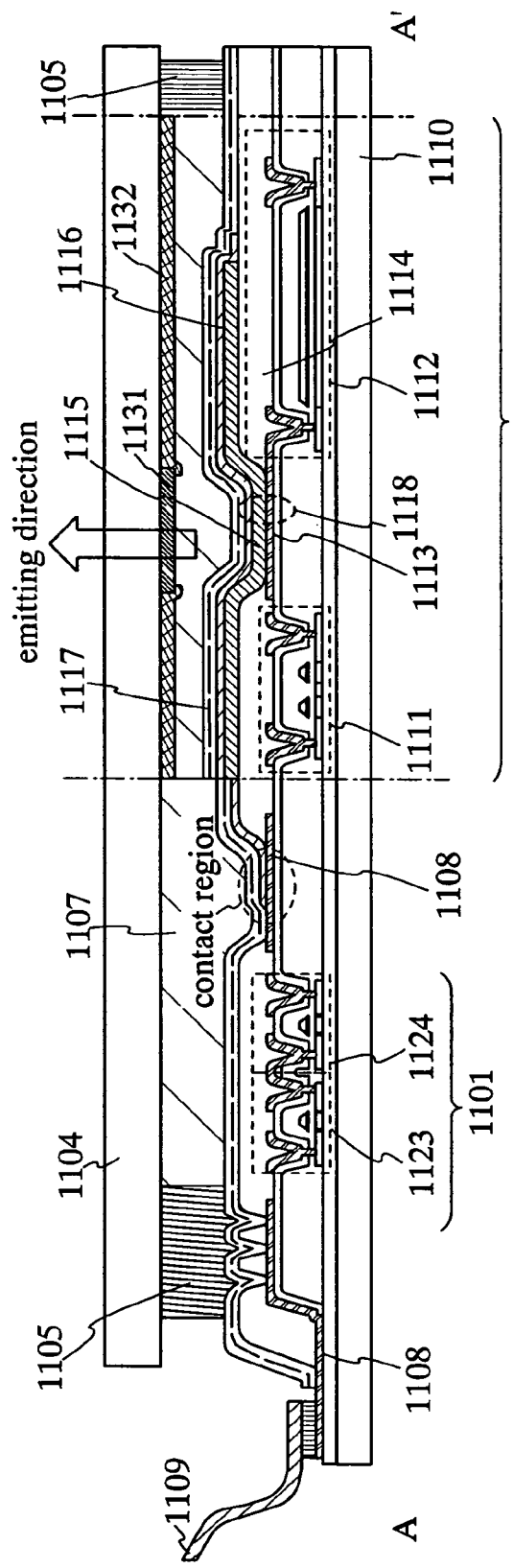

In the present embodiment, FIGS. 10A and 10B show an example where a light emitting device (a top emission structure) having a light emitting element with an organic compound layer as a light emitting layer is fabricated on a substrate having an insulating surface.

It should be noted that FIG. 10A is a top plan view showing the light emitting device and FIG. 10B is a cross-sectional view taken by cutting along a line A–A' in FIG. 10A. Reference numeral 1101 shown by a dotted line denotes a source signal driver circuit, 1102 denotes a pixel portion, and 1103 denotes a gate signal driver circuit. Further, reference numeral 1104 denotes a transparent sealing substrate, 1105 denotes a first sealing member, and a portion surrounded by the first sealing member 1105 is filled with a transparent second sealing member 1107. Note that the first sealing member 1105 includes a gap member for keeping the distance between the substrates.

It should be noted that 1108 denotes a wiring for transferring a signal inputted into the source signal driver circuit 1101 and the gate signal driver circuit 1103, and it receives a video signal and a clock signal from an FPC (Flexible Printed Circuit) 1109 as an external input terminal. Note that only FPC is shown here, however, a printed wiring board (PWB) may be provided for this FPC.

A cross-sectional structure is described with reference to FIG. 10B. The source signal driver circuit 1101 and the pixel portion 1102 are shown here as a driver circuit and a pixel portion formed on a substrate 1110.

It should be noted that the source signal driver circuit 1101 is a CMOS circuit formed with an n-channel TFT 1123 and a p-channel TFT 1124. Further, the driver circuit comprising a TFT may be formed with a known CMOS circuit, PMOS circuit, or an NMOS circuit. Moreover, shown in the present embodiment is a driver integrated type where a driver circuit is formed on a substrate, however, the driver circuit can be formed externally as well. The structure of the TFT having a polysilicon layer as an active layer is not particularly limited, and it may be a top gate TFT or a bottom gate TFT.

The pixel portion 1102 is formed with a plurality of pixels each of which includes a switching TFT 1111, a current control TFT 1112, and a first electrode (anode) 1113 connected to the drain of the current control TFT. The current control TFT 1112 may be an n-channel TFT or a p-channel TFT, however, it is preferably a p-channel TFT in the case of connecting with the anode. Further, a capacitor (not shown) is preferably provided appropriately. Note that shown here is a cross-sectional view of only one of the numerous pixels and an example of providing two TFTs in the pixel, however, three or more TFTs may be provided as well.

The first electrode 1113 is directly connected to the drain of the TFT, therefore it is preferable that the lower layer of the first electrode 1113 is a material layer which can have an ohmic contact with the drain formed of silicon, and the top layer which is in contact with the organic compound layer is a high work function material layer. For example, in the case where a three-layer structure of a nitride titanium film, an aluminum-based film, and a nitride titanium film is employed, resistance also as a wiring is low, a favorable ohmic contact can be obtained, and it can function as an anode. Further, the first electrode 1113 may be a single or a laminated layers of three or more layers of a nitride titanium film, a chrome film, a tungsten film, a Zn film, and a Pt film and the like.

Furthermore, an insulator (also referred to as a bank, a partition, a barrier, a mound or the like) 1114 is formed at both ends of the first electrode (anode) 1113. The insulator 1114 may be formed with an organic resin layer or an insulating layer having silicon. Here, an insulator in a shape shown in FIG. 10B is formed by using a positive working photosensitive acryl resin film as the insulator 1114.

In order to attain a good coverage, it is preferable to curve an upper edge portion or a lower edge portion of the insulator 1114 to give a radius of curvature. If positive working photosensitive acrylic is used as a material of the insulator 1114, for example, it is preferable to curve only an upper edge portion of the insulator to give a radius of curvature (preferably, 0.2 to 3 ì m). A negative working photosensitive material which becomes insoluble in an etchant under light and a positive working photosensitive material which becomes soluble in an etchant under light both can be used for the insulator 1114.

The insulator 1114 may be covered with a protective film made from an aluminum nitride film, an aluminum oxynitride film, a carbon-based thin film, or a silicon nitride film.

An organic compound layer 1115 is selectively formed on the first electrode (anode) 1113 by vapor deposition. In this embodiment, the organic compound layer 1115 is formed by the vapor deposition apparatus shown in FIG. 1 to obtain a uniform thickness. A second electrode (cathode) 1116 is formed on the organic compound layer 1115. As the cathode, a low work function member (Al, Ag, Li, Ca, or alloys of the aforementioned metals, MgAg, MgIn, AlLi, $CaF_2$, or CaN) may be used. As the second electrode (cathode) 1116 here, a laminated film of a thin metal film and a transparent conductive film (ITO (indium tin oxide alloy), an indium oxide-zinc oxide alloy ($In_2O_3$—ZnO), and a zinc oxide (ZnO) and the like) is employed here. In this manner, a light emitting element 1118 comprising the first electrode (anode) 1113, the organic compound layer 1115, and the second electrode (cathode) 1116 is formed. In this embodiment, a white light is emitted by sequentially laminating an aromatic diamine layer (TPD), a p-EtTAZ layer, an $Alq_3$ layer, an $Alq_3$ layer doped with Nile Red, and an $Alq_3$ layer. Since an example in which the light emitting element 1118 emits white light is shown here, a color filter formed of a coloring layer 1131 and a light shield (BM) 1132 (for ease of illustration, an over coat layer is not shown here) is provided.

In the case of selectively forming organic compound layers that can achieve R, G, B luminescence respectively, a full color display can be realized without a color filter.

In order for the light emitting element 1118 to be encapsulated, a transparent protective lamination layer 1117 is formed. The transparent protective lamination layer 1117 is a lamination of a first inorganic insulating layer, a stress relaxation layer, and a second inorganic insulating layer. As the first inorganic insulating layer and the second inorganic insulating layer, a silicon nitride film, a silicon oxide film, and a silicon oxynitride film (a SiNO film (component ratio: N>O) or a SiON film (component ratio: N<O)), and a carbon-based thin film (for example a DLC film and a CN film) may be utilized. These inorganic insulating layers each have a high blocking effect against moisture; however, as film thickness thereof is increased, a film stress is increased and they tend to be partially peeled or totally removed as a film. Nevertheless, stress can be relaxed and, also, moisture can be absorbed by sandwiching a stress relaxation layer between the first and second inorganic insulating layers. Even when a minute hole (such as a pin hole) is formed in the first inorganic insulating layer, the minute hole can be blocked by the stress relaxation layer and, further, by providing the second inorganic insulating layer thereover, an extremely high blocking effect against moisture or oxygen can be attained. For the stress relaxation film, it is preferable to use a material that has smaller stress than that of the inorganic insulating film and has hygroscopic property, in addition, translucency. As a material for the stress relaxation film, a material film including the following organic compounds; α-NPD (4,4'-bis [N-(1-naphthyl)-N-phenyl-amino]-biphenyl), BCP (batho-cuproine), MTDATA (4,4',4"-tris[N-(3-methylphenl)-N-phenyl-amino]-triphenylamine), $Alq_3$ (tris (8-quinolinolato) aluminum) and the like may be used. These material films having hygroscopic property are almost transparent when they have thin film thickness. Since MgO, $SrO_2$, and SrO have hygroscopic property and translucency and can be deposited as a thin film, they can be used for the stress relaxation film. In this embodiment, a silicon target is used, a film formed in an atmosphere containing a nitrogen gas and an argon gas, that is, a silicon nitride film having a high blocking effect against impurities such as moisture and an alkali metal is used as the first or the second inorganic insulating film, and a thin film of $Alq_3$ formed by vapor deposition is used as the stress relaxation film. Further, in order to allow luminescence to penetrate the transparent protective lamination layer, it is preferable that an entire film thickness of the transparent protective lamination layer is formed as thin as possible.

Further, in order to seal the light emitting device 1118, the sealing substrate 1104 is bonded thereto by using the first sealing member 1105 and the second sealing member 1107 in an inert gas atmosphere. As for the first sealing member 1105 and the second sealing member 1107, it is preferable that an epoxy resin is used. It is also preferable that the first sealing member 1105 and the second sealing member 1107 are each made of a material which allows as little moisture or oxygen as possible to penetrate thereinto.

Further, in this embodiment, a plastic substrate made of FRP (fiberglass-reinforced plastics), PVF (polyvinylfluoride), Mylar, polyester, acrylic resin, or the like, in addition to a glass substrate or a quartz substrate can be used as a material which constitutes the sealing substrate 1104. After the sealing substrate 1104 is bonded using the first sealing member 1105 and the second sealing member 1107, it is possible to perform sealing by a third sealing member so that a side face (exposed face) of the substrate is covered.

By sealing the light emitting device in the first sealing member 1105 and the second sealing member 1107 as above-described, the light emitting device can thoroughly be shielded from outside, and thereby a substance such as moisture and oxygen, which deteriorates the organic compound layer can be prevented from entering from outside. Accordingly, a light emitting device having a high reliability can be obtained.

Further, a dual emission light emitting device can be fabricated by using a transparent conductive film as the first electrode 1113.

Figure 12A:
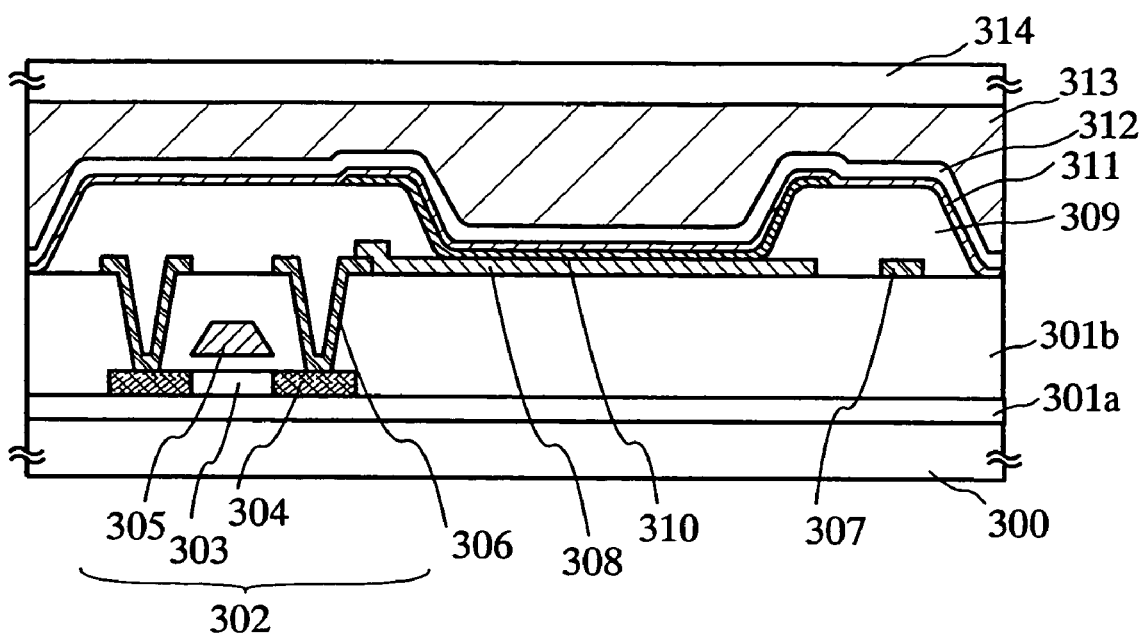
FIGS. 12A and 12B are diagrams showing Embodiment 3.
Figure 12B:
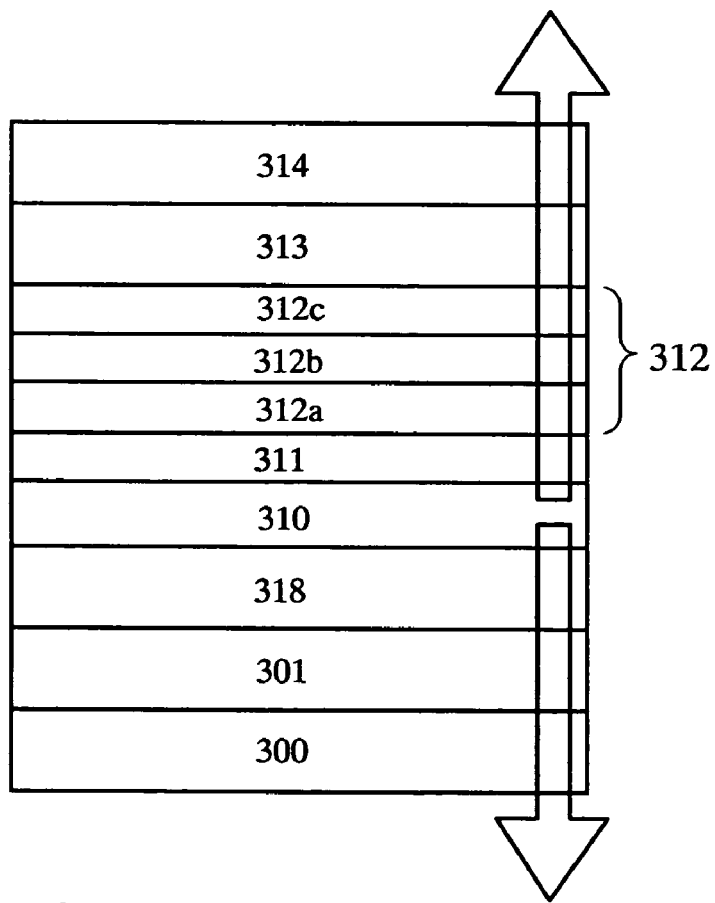

Hereinafter described with reference to FIGS. 12A and 12B is a dual emission light emitting device.

FIG. 12A is a cross-sectional view of one portion of the pixel portion. FIG. 12B is a simplified view of a laminated structure in a light emitting region. As shown in FIG. 12B, a light can be emitted in both top and bottom directions. As for an arrangement of a light emitting region, namely, an arrangement of pixel electrodes, a stripe arrangement, a delta arrangement, a mosaic arrangement and the like can be employed.

In FIG. 12A, reference numeral 300 denotes a first substrate, 301a and 301b each denotes an insulating layers, 302 denotes a TFT, 308 denotes a first electrode, 309 denotes an insulator, 310 denotes an EL layer, 311 denotes a second electrode, 312 denotes a transparent protective laminate, 313 denotes a second sealing member, and 314 denotes a second substrate.

The TFT 302 (p-channel TFT) formed on the first substrate 300 is an element for controlling current flowing in the light emitting EL layer 310, and 304 denotes a drain region (or a source region) of the TFT. Further, 306 denotes a drain electrode (or a source electrode) which connects a first electrode and the drain region (or the source region). Further a wiring 307, such as a power supply line or a source wiring, is formed in the same step as the drain electrode 306 at the same time. An example in which the first electrode and the drain electrode are formed separately is shown here, but they may also be formed as one electrode. The insulating layer 301a which becomes a base insulating layer (a nitride insulating film as a lower layer, and an oxide insulting film as an upper layer here) is formed on the first substrate 300, and a gate insulating layer is formed between a gate electrode 305 and an active layer. Further, 301b denotes an interlayer insulating film made from an organic material or an inorganic material. Further, although not shown here, one or a plurality of additional TFT (n-channel TFTs or p-channel TFTs) may also be formed in one pixel. Furthermore, although a TFT having one channel forming region 303 is shown here, the invention is not exclusively limited to this, but a TFT having a plurality of channels may also be used.

Further, reference numeral 308 is the first electrode as a transparent conductive layer, that is, an anode (or a cathode) of the EL element. As the transparent conductive layer, ITO (indium oxide-tin oxide alloy), indium oxide-zinc oxide alloy ($In_2O_3$—ZnO), or zinc oxide (ZnO) and the like may be used.

Further, an insulator 309 (also referred to as a bank, a partition, a barrier, a mound or the like) which covers an edge of the first electrode 318 (and the wiring 307) is provided. As for the insulator 309, an inorganic material (for example, silicon oxide, silicon nitride, or silicon oxynitride), a photosensitive or non-photosensitive organic material (for example, polyimide, acrylic resin, polyamide, polyimidoamide, resist or benzocyclobutene), or a laminate of these materials, or the like can be used; however, a photosensitive organic resin covered with a silicon nitride film is used here. For example, when a positive working photosensitive acrylic resin is used as an organic resin material, it is preferable that only an upper edge portion of the insulating material is allowed to have a curved surface having a curvature radius. Further, as for the insulator, either a negative working type which becomes insoluble to an etchant by photosensitive light or a positive working type which becomes soluble to the etchant by the light can be used.

The EL layer 310 containing an organic compound is formed by vapor deposition or coating. In order to enhance the reliability, it is preferable that degasification is performed by vacuum heating (100 to 250° C.) just before the layer 310 containing the organic compound is formed. For example, when vapor deposition is used, such vapor deposition is performed in a film formation chamber which is evacuated into a vacuum state up to a degree of $5 \times 10^{-3}$ Torr (0.665 Pa) or less, or more preferably in the range of from $10^{-4}$ to $10^{-6}$ Pa. At the vapor deposition process, the organic compound is vaporized in advance by resistive heating, and when a shutter is opened during the vapor deposition, the vaporized organic compound is scattered in the direction of a substrate. The vaporized organic compound then flies upward, and is deposited over the substrate through an aperture provided on a metal mask.

For example, a white color can be obtained by laminating $Alq_3$, $Alq_3$ partially doped with Nile Red which is a red-color luminescent pigment, p-EtTAZ, and TPD (aromatic diamine) sequentially by vapor deposition.

Further, reference numeral 311 denotes the second electrode made from a conductive film, that is, a cathode (or an anode) of the light emitting element. A film of an alloy such as MgAg, MgIn, AlLi, $CaF_2$, and CaN, or a film having translucency and formed by co-deposition of aluminum with an element of group 1 or 2 of the periodic table, may be used as a material for the second electrode 311 material. A dual emission light emitting device which emits light that passes through the second electrode is manufactured here; therefore an aluminum film 1 to 10 nm in thickness, or an aluminum film that contains a minute amount of Li is used. When employing an Al film for the second electrode 311, it becomes possible to form the material contacting the layer 310 which is in contact with the second electrode 311 and contains an organic compound with a material other than an oxide, and the reliability of the light emitting device can be enhanced. Further, a layer (film thickness 1 to 5 nm) having translucency and made from $CaF_2$, $MgF_2$, or $BaF_2$ may also be formed as a cathode buffer layer before forming the aluminum film 1 to 10 nm in thickness.

Further, a transparent conductive film (for example, ITO (indium oxide-tin oxide alloy), indium oxide-zinc oxide alloy ($In_2O_3$—ZnO), or zinc oxide (ZnO) and the like) may also be formed on the metal thin film which is 1 to 10 nm in thickness for reducing resistance of the cathode. An auxiliary electrode may also be formed on the second electrode 311 in a region which does not become a light emitting region for reducing resistance of the cathode. Furthermore, the cathode may be formed selectively by using resistive heating deposition with an evaporation mask.

Further, reference numeral 312 denotes a transparent protective laminate formed by sputtering or vapor deposition, which is a sealing film for protecting the second electrode 311 made from a metallic thin film and preventing the moisture. As shown in FIG. 12B, the transparent protective laminate 312 is a lamination of an inorganic insulating layer 312a, a stress relaxation layer 312b, and an inorganic insulating layer 312c. As for the inorganic insulating layer 312a, a silicon nitride film, a silicon oxide film, a silicon oxynitride film (SiNO film (component ratio: N>O), or SiON film (component ratio: N<O)), or a carbon-based thin film (for example, a DLC film, or a CN film) to be obtained by sputtering or CVD can be used. These inorganic insulating films each has a high blocking effect against moisture; however, as film thickness thereof is increased, film stress is increased and they tend to be partially peeled or totally removed as a film. Nevertheless, by sandwiching the stress relaxation layer 312b between the inorganic insulating films 312a and 312b, stress can be relaxed and moisture can be absorbed. Even when a minute hole is formed in the inorganic insulating film 312a, the minute hole can be blocked by the stress relaxation layer 312b, and by providing another inorganic insulating film 312c thereover, an extremely high blocking effect against moisture or oxygen can be attained.

As for materials for the stress relaxation film 312b, a material which has smaller stress than the inorganic insulating films 312a and 312c and has a hygroscopic property is preferably used. In addition to the above-described properties, a material having a translucent property is desirable. Further, as for the stress relaxation film 312b, a material film containing an organic compound such as α-NPD (4,4'-bis [N-(naphthyl)-N-phenyl-amino]biphenyl), BCP (bathocuproin), MTDATA (4,4',4"-tris(N-3-methylphenyl-N-phenyl-amino)triphenylamine), and $Alq_3$ (a tris-8-quinolinolate aluminum complex) may be used. Each of these material films has a hygroscopic property. Also, they are nearly transparent when they are thin in thickness. When they become thin in thickness, they become nearly transparent. Since MgO, SrO2, and SrO each have a hygroscopic property and translucency, and a thin film thereof can be obtained by vapor deposition, thus any one of these oxides can be used as the stress relaxation film 312b.

Further, as for the stress relaxation film 312b, the same material used in the organic compound layer, which is sandwiched between the cathode and the anode can also be used.

In the case where it is possible to form the inorganic insulating films 312a and 312b by sputtering (or CVD) and the stress relaxation film 312b by vapor deposition, a substrate is transported back and forth between an evaporation chamber and a sputtering film formation chamber (or a CVD film formation chamber) whereas it is a merit that there is no need of providing another film formation chamber. Although it is conceivable to use an organic resin film as the stress relaxation film, it is necessary to subject the organic resin film to a baking treatment since the organic resin film contains a solvent, therefore, there are problems such as an increase of the number of production steps, contamination by a solvent component, damage by baking heat, and a necessity of degasification.

The transparent protective laminate 312 formed in this manner is optimum as a sealing film of a light emitting element which comprises a light emitting layer containing an organic compound. Since the transparent protective laminate 312 has a hygroscopic property, it also functions to remove moisture.

The second sealing member 313 bonds the second substrate 314 and the first substrate 300. The first sealing member (not shown), which comprises a gap material for keeping a distance between the substrates, is arranged such that it surrounds the second sealing member 313. The second sealing member 313 is not particularly limited so long as it is translucent; typically, an epoxy resin curable by an ultraviolet ray or by heat may be used. Used here is a high heat-resistant UV epoxy resin (2500 Clear; available from Electrolyte) having a refractive index of 1.50, a viscosity of 500 cps, a Shore-D hardness of 90, a tensile strength of 3000 psi, a Tg point of 150° C., a volume resistance of $1\times10^{15}$ Ωcm, and an electric strength of 450 V/mil. It is possible to improve an entire light transmittance by filling a gap between a pair of substrates with the second sealing member 313 compared with the case in which the gap between the pair of substrates is a space (inert gas).

A structure having a light emitting device in which an organic compound layer is formed on an anode and a cathode is formed on the organic compound layer and allowing luminescence generated in a organic compound layer to emit from the anode as a transparent electrode toward a TFT (hereinafter referred to as a bottom emission structure) may also be adopted.

Figure 11A:
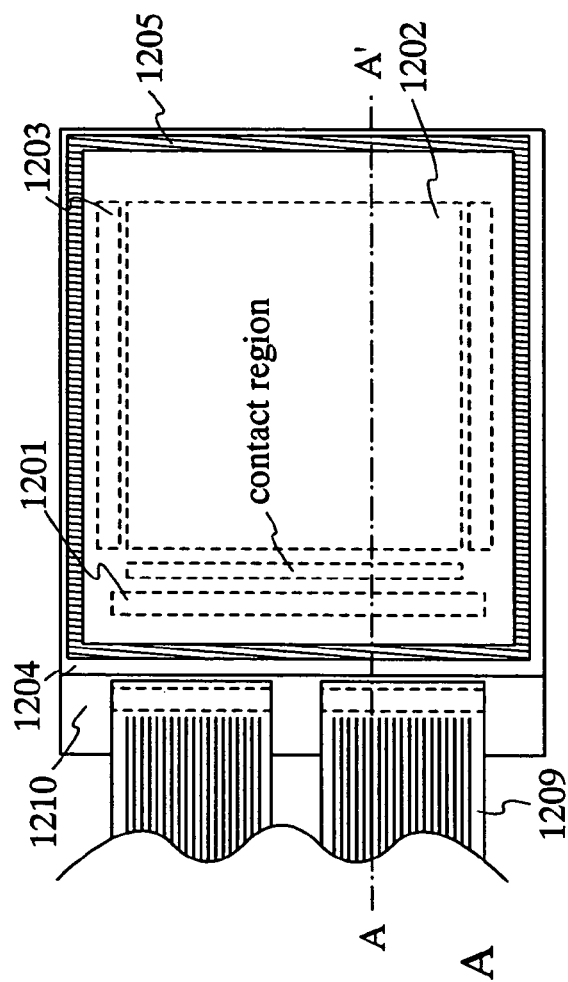
FIGS. 11A and 11B are diagrams showing Embodiment 3.
Figure 11B:
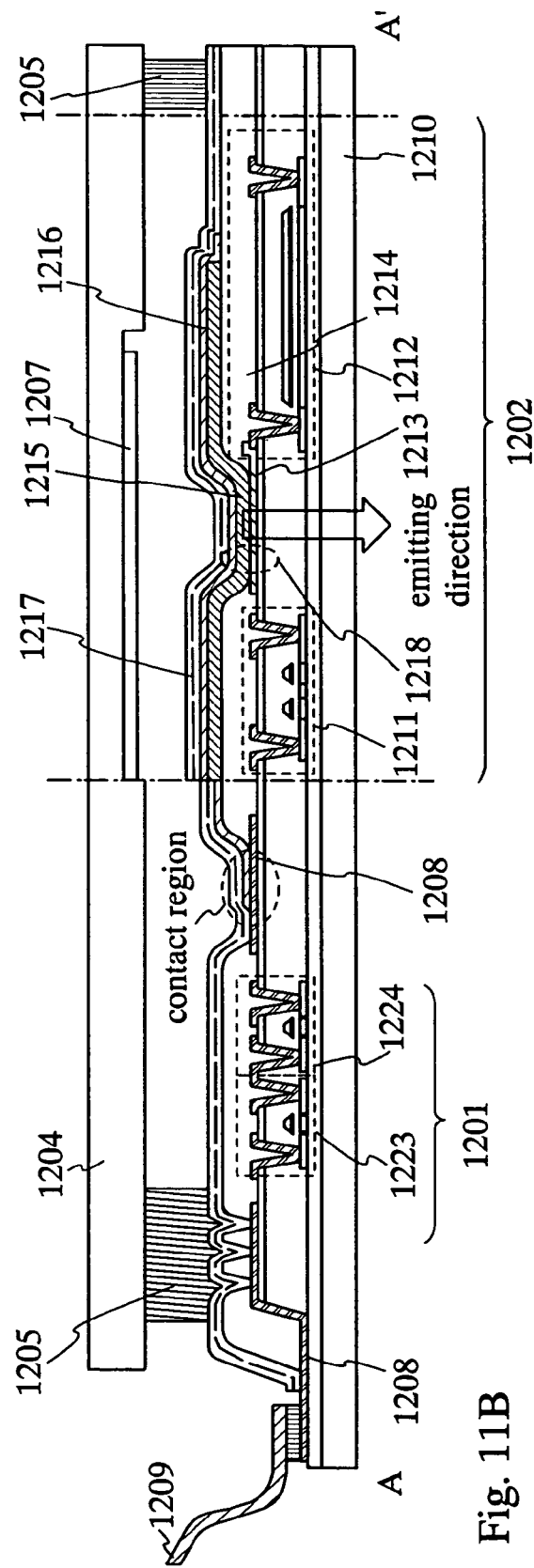

An example of a light emitting device having a bottom emission structure is shown in FIGS. 11A and 11B.

FIG. 11A is a top plan view of the light emitting device, while FIG. 11B is a cross-sectional view taken along a line A–A' in FIG. 11A. Reference numeral 1201 indicated by a dotted line denotes a source signal driver circuit, 1202 denotes a pixel portion, and 1203 denotes a gate signal driver circuit. Further, 1204 denotes a sealing substrate, 1205 denotes a sealing member which comprises a gap material for keeping a sealed space, and an inside of an area surrounded by the sealing member 1205 is filled with an inert gas (typically, a nitrogen gas). A minute amount of moisture present in the space inside the area surrounded by the sealing member 1205 is removed by a desiccant 1207 and, accordingly, the space is sufficiently dry.

Reference numeral 1208 denotes a wiring for transmitting a signal to be inputted to the source signal driver circuit 1201 and the gate signal driver circuit 1203. The wiring 1208 receives a video signal or a clock signal from an FPC (flexible printed circuit) 1209 which is an external input terminal.

Subsequently, a cross-sectional structure will be described with reference to FIG. 11B. A driver circuit and a pixel portion are formed over a substrate 1210, but the pixel portion 1202 and the source signal driver circuit 1201 as the driver circuit are shown in FIG. 11B. In the source signal driver circuit 1201, a CMOS circuit in which an n-channel TFT 1223 and a p-channel TFT 1224 are combined is formed.

The pixel portion 1202 is formed with a plurality of pixels each of which has a switching TFT 1211, a current control TFT 1212 and a first electrode (anode) 1213 as a transparent conductive film which is electrically connected to a drain of the current control TFT 1212.

In this embodiment, a structure in which the first electrode 1213 is formed in such a manner that a part thereof is overlapped with a connecting electrode and the first electrode 1213 is electrically connected to a drain region of the TFT via a connecting electrode. It is preferable that the first electrode 1213 has transparency and comprises a conductive film having a high work function (for example, an indium oxide-tin oxide alloy (ITO), an indium oxide-zinc oxide alloy ($In_2O_3$—ZnO), or zinc oxide (ZnO)).

An insulator 1214 (referred to as a bank, a partition wall, a barrier, a mound or the like) is formed on each end of the first electrode (anode) 1213. In order to attain a good coverage, a curved surface having a curvature is formed in an upper or a lower end portion of the insulator 1214.

Further, the insulator 1214 may be covered with a protective film comprising an aluminum nitride film, an aluminum oxynitride film, a carbon-based thin film or a silicon nitride film.

An organic compound layer 1215 is selectively formed on the first electrode (anode) 1213 by vapor deposition. In this embodiment, the organic compound layer 1215 with uniform film thickness is formed by the vapor deposition apparatus shown in FIGS. 5A–5E. Further, a second electrode (cathode) 1216 is formed on the organic compound layer 1215. As for the cathode, a material having a low work function (for example Al, Ag, Li, Ca, alloys of thereof, that is, MgAg, MgIn, AlLi, CaF2, or CaN) may be used. In this manner, a light emitting element 1218 comprising the first electrode (anode) 1213, the organic compound layer 1215, and the second electrode (cathode) 1216 is fabricated. The light emitting element 1218 emits light in a direction indicated by an arrow shown in FIG. 11B. The light emitting element 1218 in this embodiment is one of light emitting elements in which mono-color luminescence of R, G, or B can be obtained. Three light emitting elements in which organic compound layers each capable of obtaining R, G, or B luminescence are selectively formed make a full-color light emitting device.

Further, a protective laminate 1217 is formed in order to seal the light emitting element 1218. The protective laminate 1217 includes a first inorganic insulating film, a stress relaxation film and a second inorganic insulating film.

Further, in order to seal the light emitting element 1218, the sealing substrate 1204 is bonded thereto by using the sealing member 1205 in an inert gas atmosphere. A recessed portion is formed in advance on the sealing substrate 1204 by a sand-blast method or the like and then, a desiccant 1207 is bonded to the recessed portion. As for the sealing member 1205, it is preferable that an epoxy resin is used. It is also preferable that the sealing member 1205 is a material that allows as little moisture or oxygen as possible to penetrate thereinto.

Further, in this embodiment, a plastic substrate made of FRP (fiberglass-reinforced plastics), PVF (polyvinyl fluoride), Mylar, polyester, an acrylic resin or the like, in addition to a metal substrate, a glass substrate or a quartz substrate can be used as a material which constitutes the sealing substrate 1204 having the recessed portion. It is also possible to perform sealing by using a metal can in which a desiccant is bonded to the inside.

Further, this embodiment can be freely combined with any one of Embodiment Modes 1 to 5 and Embodiments 1 and 2.

Electronic apparatuses can be produced by implementing a light emitting device obtained by the invention to a display portion therein. Examples of the electronic apparatuses include a video camera, a digital camera, a goggle display (head mounted display), a navigation system, an audio reproducing apparatus (a car audio, an audio component, and the like), a laptop computer, a game machine, a portable information terminal (a mobile computer, a cellular phone, a portable game machine, an electronic book, etc.), and an image reproducing apparatus having a recording medium (specifically, an apparatus capable of processing data in a recording medium such as a Digital Versatile Disk (DVD) and having a display that can display the image of the data). Specific examples thereof are shown in FIGS. 13A to 13H.

Figure 13A:
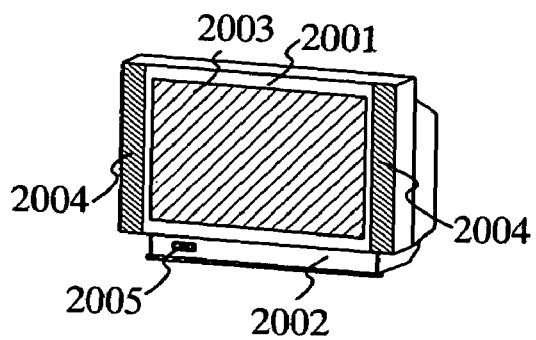
FIGS. 13A to 13H are examples of electronic apparatuses. (Embodiment 4)

FIG. 13A shows a television, which comprises a housing 2001, a supporting base 2002, a display portion 2003, speaker units 2004, a video input terminal 2005, etc. The invention can be applied to the display portion 2003. The term television includes every television for displaying information such as one for a personal computer, receiving TV broadcasting, and for advertisement.

Figure 13B:
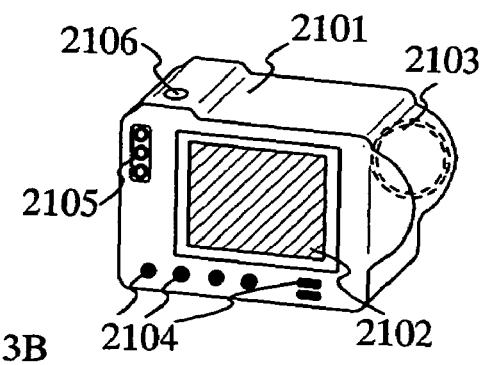

FIG. 13B shows a digital camera, which comprises a main body 2101, a display portion 2102, an image receiving unit 2103, operation keys 2104, an external connection port 2105, a shutter 2106, etc. The invention can be applied to the display portion 2102.

Figure 13C:
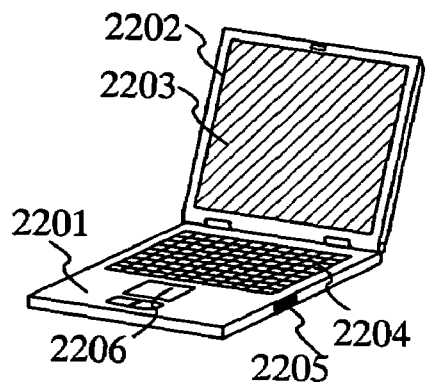

FIG. 13C shows a laptop computer, which comprises a main body 2201, a housing 2202, a display portion 2203, a keyboard 2204, an external connection port 2205, a pointing mouse 2206, etc. The invention can be applied to the display portion 2203.

Figure 13D:
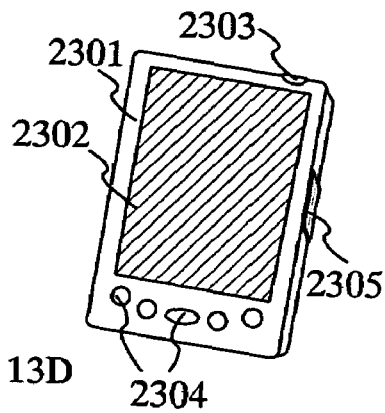

FIG. 13D shows a mobile computer, which comprises a main body 2301, a display portion 2302, a switch 2303, operation keys 2304, an infrared ray port 2305, etc. The invention can be applied to the display portion 2302.

Figure 13E:
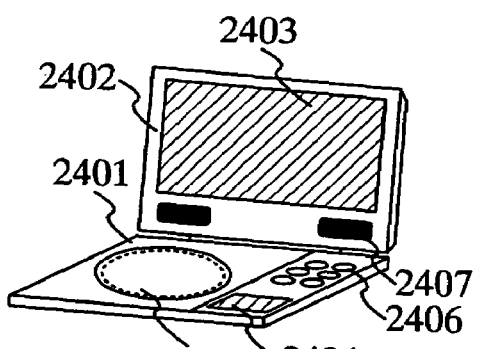

FIG. 13E shows a portable image reproducing apparatus having a recording medium (a DVD player, to be specific). The apparatus comprises a main body 2401, a housing 2402, display portions A2403 and B2404, a recording medium (such as DVD) reading unit 2405, operation keys 2406, speaker units 2407, etc. The display portion A2403 mainly displays image information whereas the display portion B2404 mainly displays text information. The invention can be applied to the display portions A 2403 and B 2404. The term image reproducing apparatus having a recording medium includes domestic game machines etc.

Figure 13F:
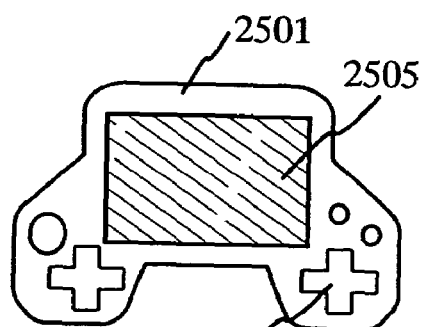

FIG. 13F shows a game machine, which comprises a main body 2501, a display portion 2505, and operation keys 2504, etc. The invention can be applied to the display portion 2505.

Figure 13G:
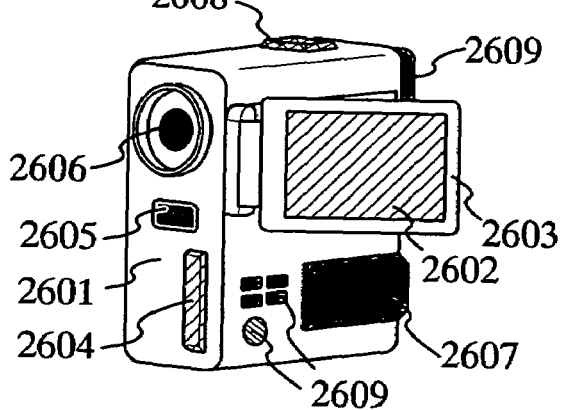

FIG. 13G shows a video camera, which comprises a main body 2601, a display portion 2602, a housing 2603, an external connection port 2604, a remote control receiving unit 2605, an image receiving unit 2606, a battery 2607, an audio input unit 2608, operation keys 2609 etc. The present invention can be applied to the display portion 2602.

Figure 13H:
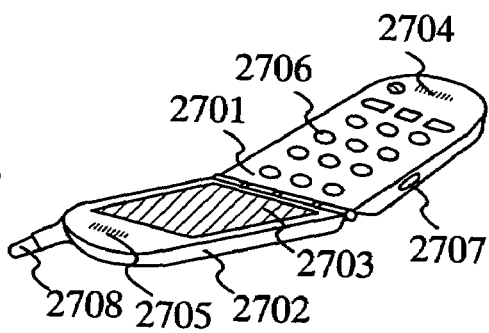

FIG. 13H shows a cellular phone, which comprises a main body 2701, a housing 2702, a display portion 2703, an audio input unit 2704, an audio output unit 2705, operation keys 2706, an external connection port 2707, an antenna 2708, etc. The present invention can be applied to the display portion 2703. In the case where the display portion 2703 displays white characters on a black background, power consumption of the cellular phone can be reduced.

As described above, the display device in which the present invention is implemented may be used as the display portions of any electronic apparatus. The electronic apparatuses of the present embodiment may use any structure of the light emitting device shown in Embodiment Modes 1 to 5 or Embodiment 1 to 3.

According to the invention, a manufacturing apparatus which is excellent in throughput and uniformity in film thickness in forming an EL layer can be realized at a reduced manufacturing cost by increasing the efficiency of utilizing the EL material. In particular, the invention is efficient in the case of utilizing a large substrate as a manufacturing cost can be drastically reduced.

Further, according to the invention, a stable deposition speed can be obtained and a film which is uniform in thickness can be deposited on a large substrate. Moreover, as a movement mechanism of the evaporation source can be made rather simple, the deposition speed can be increased by reciprocating the evaporation source a plurality of times at a higher speed.

Although the invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method for manufacturing a semiconductor device comprising:
   depositing a film over a substrate by repeatedly moving a first evaporation source and a second evaporation source in an X direction while moving the substrate in a Y direction at regular intervals,
   wherein the first evaporation source and the second evaporation source are provided in a same chamber in which the film is deposited.

2. The method according to claim 1, wherein the semiconductor device is incorporated into an electronic apparatus selected from the group consisting of a video camera, a digital camera, a goggle display, a navigation system, an audio reproducing apparatus, a laptop computer, a game machine, a mobile computer, a cellular phone, a portable game machine, an electronic book, and an image reproducing apparatus.

3. The method according to claim 1, wherein at least one of the first evaporation source and the second evaporation source includes at least two crucibles arranged in the X direction.

4. A method for manufacturing a semiconductor device comprising;
   depositing a film over a substrate by repeatedly moving the substrate in a Y direction at regular intervals while making a movement speed of a first evaporation source in an X direction and a movement speed of a second evaporation source in the X direction different,
   wherein the first evaporation source and the second evaporation source are provided in a same chamber in which the film is deposited.

5. The method according to claim 4, wherein the semiconductor device is incorporated into an electronic apparatus selected from the group consisting of a video camera, a digital camera, a goggle display, a navigation system, an audio reproducing apparatus, a laptop computer, a game machine, a mobile computer, a cellular phone, a portable game machine, an electronic book, and an image reproducing apparatus.

6. The method according to claim 4, wherein at least one of the first evaporation source and the second evaporation source includes at least two crucibles arranged in the X direction.

7. A method for manufacturing a semiconductor device comprising:
   depositing a film over a substrate by moving an evaporation source including first and second crucibles in the X direction while moving the substrate in the Y direction,
   wherein each of the first and second crucibles includes shutter.

8. The method according to claim 7, wherein the semiconductor device is incorporated into an electronic apparatus selected from the group consisting of a video camera, a digital camera, a goggle display, a navigation system, an audio reproducing apparatus, a laptop computer, a game machine, a mobile computer, a cellular phone, a portable game machine, an electronic book, and an image reproducing apparatus.

9. The method according to claim 7, wherein the evaporation source includes the first and second crucibles arranged in the X direction.

10. A method for manufacturing a semiconductor device comprising:
depositing an EL material over a substrate by repeatedly moving a first evaporation source and a second evaporation source in an X direction while moving the substrate in a direction at regular intervals,
wherein the first evaporation source and the second evaporation source are provided in a same chamber in which the EL material is deposited.

11. The method according to claim 10, wherein the semiconductor device is incorporated into an electronic apparatus selected from the group consisting of a video camera, a digital camera, a goggle display, a navigation system, an audio reproducing apparatus, a laptop computer, a game machine, a mobile computer, a cellular phone, a portable game machine, an electronic book, ad an image reproducing apparatus.

12. The method according to claim 10, wherein at least one of the first evaporation source and the second evaporation source includes at least two crucibles arranged in the X direction.

13. A method for manufacturing a semiconductor device comprising:
depositing an EL material over a substrate by repeatedly moving the substrate in a Y direction at regular intervals while making a movement speed of a first evaporation source in an X direction and a movement speed of a second evaporation source in the X direction different,
wherein the first evaporation source and the second evaporation source are provided in a same chamber in which the EL material is deposited.

14. The method according to claim 13, wherein the semiconductor device is incorporated into an electronic apparatus selected from the group consisting of a video camera, a digital camera, a goggle display, a navigation system, an audio reproducing apparatus, a laptop computer, a game machine, a mobile computer, a cellular phone, a portable game machine, an electronic book, and a image reproducing apparatus.

15. The method according to claim 13, wherein at least one of the first evaporation source and the second evaporation source includes at least two crucibles arranged in the X direction.

16. A method for manufacturing a semiconductor device comprising:
depositing an EL material over a substrate by moving an evaporation source including first and second crucibles in the X direction while moving the substrate in the Y direction,
wherein each of the first and second crucibles includes a shutter.

17. The method according to claim 16, wherein the semiconductor device is incorporated into an electronic apparatus selected from the group consisting of a video camera, a digital camera, a goggle display, a navigation system, an audio reproducing apparatus, a laptop computer, a game machine, a mobile computer, a cellular phone, a portable game machine, an electronic book, and an image reproducing apparatus.

18. The method according to claim 16, wherein the evaporation source includes the first and second crucibles arranged in the X direction.

19. A method for manufacturing a semiconductor device comprising:
depositing a film over a substrate by moving a first evaporation source and a second evaporation source in the X direction while moving the substrate in the Y direction at a constant speed,
wherein at least one of the first evaporation source and the second evaporation source includes first and second crucibles, and
wherein each of the first and second crucibles includes a shutter.

20. The method according to claim 19, wherein the semiconductor device is incorporated into an electronic apparatus selected from the group consisting of a video camera, a digital camera, a goggle display, a navigation system, an audio reproducing apparatus, a laptop computer, a game machine, a mobile computer, a cellular phone, a portable game machine, an electronic book, and an image reproducing apparatus.

21. The method according to claim 19, wherein the first and second crucibles are arranged in the X direction.

22. The method according to claim 19, wherein the first evaporation source and the second evaporation source are provided in a same chamber in which the film is deposited.

23. A method for manufacturing a semiconductor device comprising:
depositing a film over a substrate by moving a first evaporation source and a second evaporation source in the X direction while moving the substrate in the Y direction at a constant speed,
wherein at least one of the first evaporation source and the second evaporation source includes first and second crucibles, and
wherein each of the first and second crucibles includes a shutter.

24. The method according to claim 23, wherein the semiconductor device is incorporated into an electronic apparatus selected from the group consisting of a video camera, a digital camera, a goggle display, a navigation system, an audio reproducing apparatus, a laptop computer, a game machine; a mobile computer, a cellular phone, a portable game machine, an electronic book, and an image reproducing apparatus.

25. The method according to claim 23, wherein the first and second crucibles are arranged in the X direction.

26. The method according to claim 23, wherein the first evaporation source and the second evaporation source are provided in a same chamber in which the EL material is deposited.

* * * * *